United States Patent [19]

Mouri et al.

[11] Patent Number: 5,255,110
[45] Date of Patent: Oct. 19, 1993

[54] DRIVING METHOD FOR OPTICAL MODULATION DEVICE USING FERROELECTRIC LIQUID CRYSTAL

[75] Inventors: Akihiro Mouri, Kokubunji; Tsutomu Toyono, Yokohama; Shuzo Kaneko, Tokyo; Yutaka Inaba, Kawaguchi; Junichiro Kanbe, Yokohama, all of Japan

[73] Assignee: Canon Kabushiki Kaisha, Tokyo, Japan

[21] Appl. No.: 666,893

[22] Filed: Mar. 8, 1991

Related U.S. Application Data

[62] Division of Ser. No. 455,299, Dec. 22, 1989, Pat. No. 5,018,841, which is a division of Ser. No. 266,169, Nov. 2, 1988, Pat. No. 5,132,818, which is a division of Ser. No. 942,716, Dec. 17, 1986, Pat. No. 4,836,656.

[30] Foreign Application Priority Data

| Dec. 25, 1985 | [JP] | Japan | 60-295304 |
| Dec. 25, 1985 | [JP] | Japan | 60-295305 |
| Dec. 25, 1985 | [JP] | Japan | 60-295308 |
| Jan. 7, 1986 | [JP] | Japan | 61-1186 |

[51] Int. Cl.⁵ .................. G02F 1/133; G09G 3/36
[52] U.S. Cl. ......................... 359/56; 345/97
[58] Field of Search .............. 350/333, 350 S; 340/784, 805; 359/56, 85, 100

[56] References Cited

U.S. PATENT DOCUMENTS

| 4,638,310 | 1/1987 | Ayliffe ............................. 350/333 |
| 4,655,561 | 4/1987 | Kanbe et al. ................ 350/350 S |
| 4,701,026 | 10/1987 | Yazaki et al. ................... 350/333 |
| 4,709,995 | 12/1987 | Kuribayashi et al. .......... 350/333 |
| 4,711,531 | 12/1987 | Masubuchi ...................... 350/333 |
| 4,712,872 | 12/1987 | Kanbe et al. ................... 350/333 |
| 4,715,688 | 12/1987 | Harada et al. .................. 350/333 |
| 4,725,129 | 2/1988 | Kondo et al. ..................... 359/56 |
| 4,728,947 | 3/1988 | Ayliffe et al. ..................... 359/56 |
| 4,800,382 | 1/1989 | Okada et al. ..................... 359/56 |

*Primary Examiner*—William L. Sikes
*Assistant Examiner*—Tai V. Duong
*Attorney, Agent, or Firm*—Fitzpatrick, Cella, Harper & Scinto

[57] ABSTRACT

An optical modulation device includes scanning electrodes and signal electrodes disposed opposite to and intersecting with the signal electrodes, and an optical modulation material disposed between the electrodes, a pixel being formed at each intersection of the electrodes and showing a contrast depending on the polarity of a voltage applied thereto. The device is driven by a method including, in a writing period for writing in all or prescribed pixels among the pixels on a selected scanning electrode, a first phase for applying a voltage of one polarity having an amplitude exceeding a first threshold voltage of the optical modulation material to the all or prescribed pixels, and a second phase for applying a voltage of the other polarity having an amplitude exceeding a second threshold voltage of the optical modulation material to a selected pixel and applying a voltage not exceeding the threshold voltages of the optical modulation material to the other pixels, respectively among the all or prescribed pixels. The maximum duration of a continually applied voltage of the same polarity applied to a pixel on a scanning electrode is 2.5 times the duration of the first phase in the writing period.

11 Claims, 29 Drawing Sheets

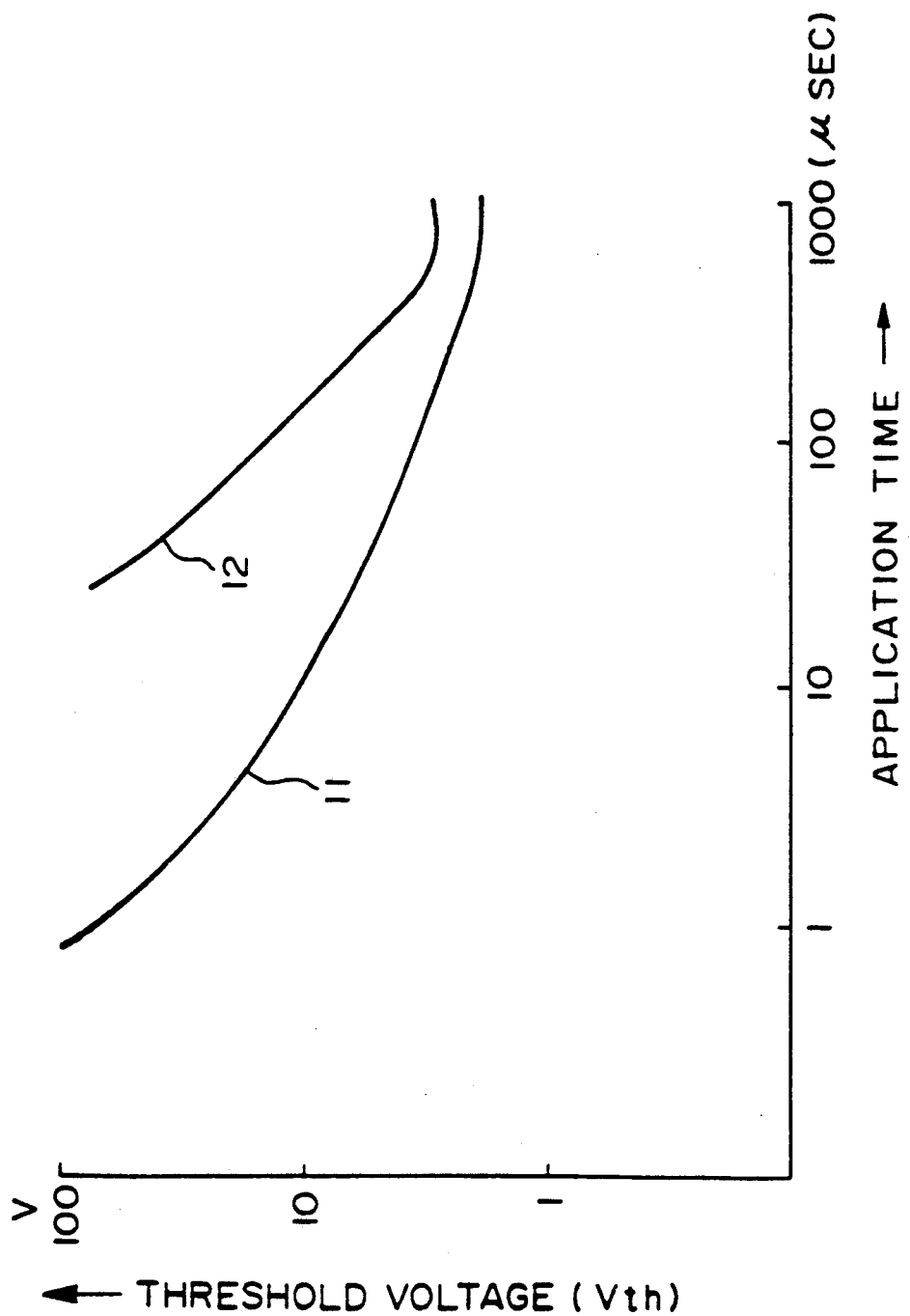
F I G. 1

F I G. 8A 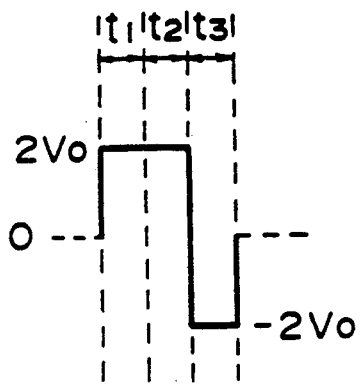
F I G. 8B 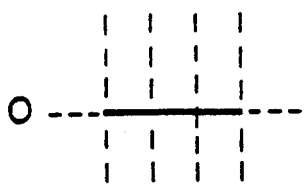
F I G. 8C 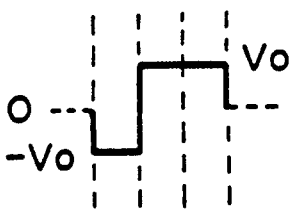
F I G. 8D 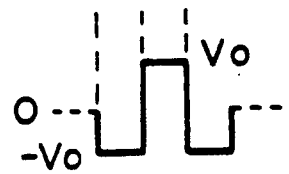

F I G. 20A 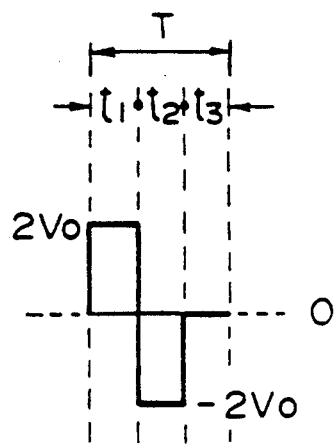
F I G. 20B 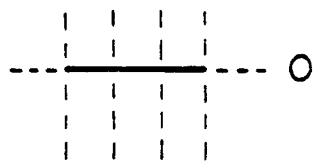
F I G. 20C 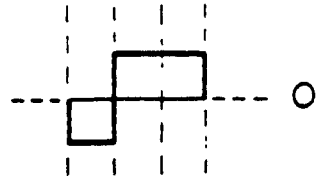
F I G. 20D 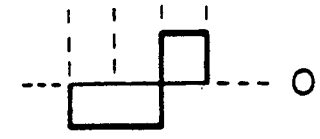

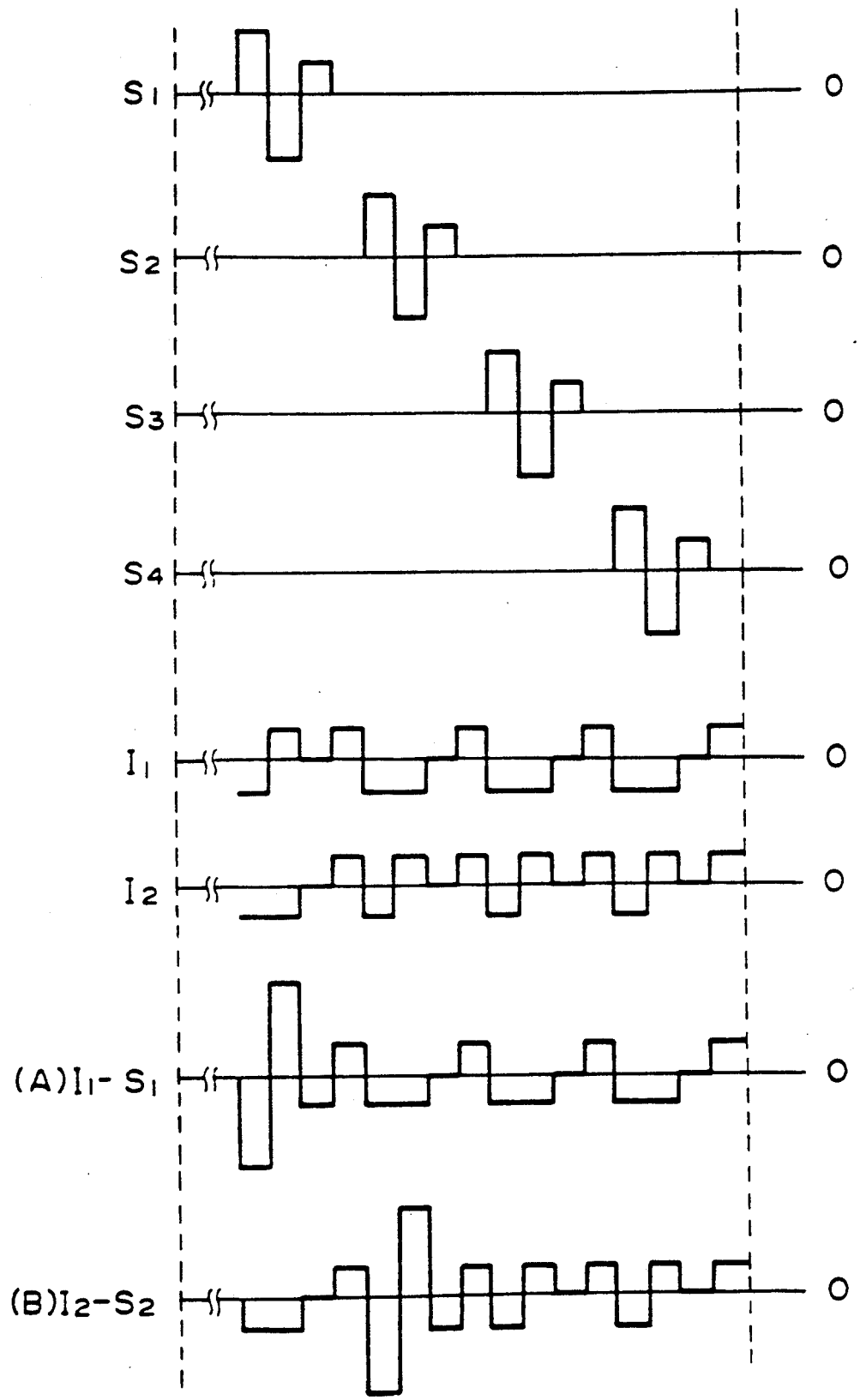
F I G. 25

F I G. 28A
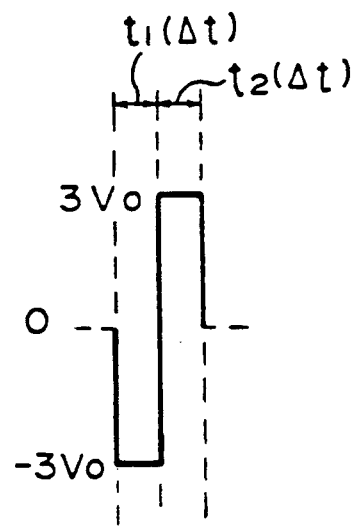
F I G. 28B
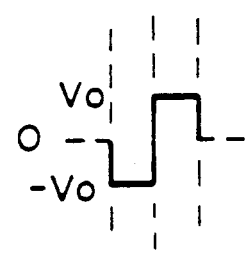
F I G. 28C
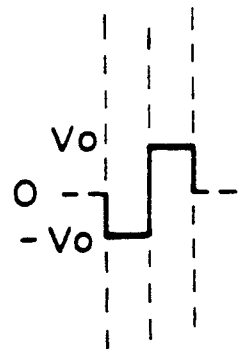
F I G. 28D
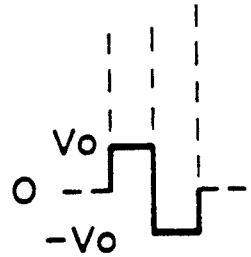

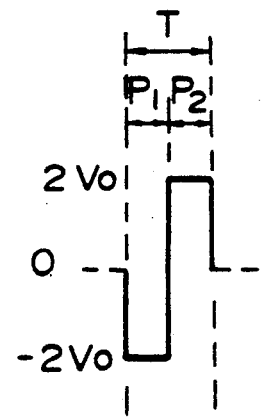
F I G. 30A
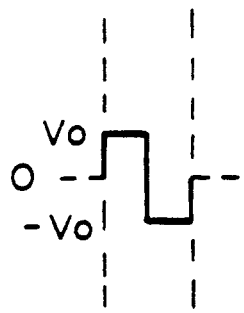
F I G. 30B
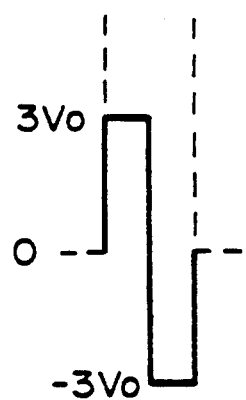
F I G. 30C

DRIVING METHOD FOR OPTICAL MODULATION DEVICE USING FERROELECTRIC LIQUID CRYSTAL

This application is a division of application Ser. No. 07/455,299 filed Dec. 22, 1989, now U.S. Pat. No. 5,018,841, which is a divisional of application Ser. No. 07/266,169 filed on Nov. 2, 1988, now U.S. Pat. No. 5,132,818 which is a divisional of application Ser. No. 06/942,716 filed on Dec. 17, 1986, now U.S. Pat. No. 4,836,656.

FIELD OF THE INVENTION AND RELATED ART

The present invention relates to a driving method for an optical modulation device in which a contrast is discriminated depending on the direction of an applied electric field, particularly a driving method for a ferroelectric liquid crystal device having at least two stable states.

Hitherto, there is well known a type of liquid crystal device wherein scanning electrodes and signal electrodes are arranged in a matrix, and a liquid crystal compound is filled between the electrodes to form a large number of pixels for displaying images or information. As a method for driving such a display device, a time-division or multiplex driving system, wherein an address signal is sequentially and periodically applied to the scanning electrodes selectively while prescribed signals are selectively applied to the signal electrodes in a parallel manner in phase with the address signal, has been adopted.

Most liquid crystals which have been put into commercial use as such display devices are TN (twisted nematic) type liquid crystals, as described in "Voltage-Dependent Optical Activity of a Twisted Nematic Liquid Crystal" by M. Schadt and W. Helfrich, Applied Physics Letters Vol. 18, No. 4 (Feb. 15, 1971) pp. 127–128.

In recent years, as an improvement on such conventional liquid crystal devices, the use of a liquid crystal device showing bistability has been proposed by Clark and Lagerwall in Japanese Laid-Open Patent Application No. 107216/1981, U.S. Pat. No. 4,367,924, etc. As bistable liquid crystals, ferroelectric liquid crystals showing chiral smectic C phase (SmC*) or H phase (SmH*) are generally used. These liquid crystal materials have bistability, i.e., a property of assuming either a first stable state or a second stable state and retaining the resultant state when the electric field is not applied, and have a high response speed in response to a change the electric field, so that they are expected to be widely used in the field of high speed and memory type display apparatus, etc.

However, this bistable liquid crystal device may still cause a problem, when the number of picture elements is extremely large and high speed driving is required, as clarified by Kanbe et al in GB-A 2141279. More specifically, if a threshold voltage required for providing a first stable state for a predetermined voltage application time is designated by $-V_{th1}$ and a threshold voltage for providing a second stable state is denoted by $V_{th2}$, respectively, for a ferroelectric liquid crystal cell having bistability, a display state (e.g., "white") written in a picture element can be inverted to the other display state (e.g., "black") when a voltage is continuously applied to the picture element for a long period of time.

FIG. 1 shows a threshold characteristic of a bistable ferroelectric liquid crystal cell. More specifically, FIG. 1 shows the dependency of a threshold voltage (Vth) required for switching display states on voltage application time when HOBACPC (showing the characteristic curve 11 in the figure) and DOBAMBC (showing curve 12) are respectively used as a ferroelectric liquid crystal.

As is apparent from FIG. 1, the threshold voltage $V_{th}$ has a dependency on the application time, and the dependency is more marked or sharper as the application time becomes shorter. As will be understood from this fact, in the case where the ferroelectric liquid crystal cell is applied to a device which comprises numerous scanning lines and is driven at a high speed, there is the possibility that even if a display state (e.g., bright state) has been given to a picture element at the time of scanning thereof, the display state is inverted to the other state (e.g., dark state) before the completion of the scanning of one whole picture area when an information signal below $V_{th}$ is continually applied to the picture element during the scanning of subsequent lines.

It has become possible to prevent the above mentioned reversal phenomenon by applying an auxiliary signal is disclosed by Kanbe et al in GB-A 2141279. However, in a case where a prescribed weak voltage is applied to a ferroelectric liquid crystal for a shorter voltage application time such an inversion can still occur. This is because when a certain signal electrode is supplied with a "white" information signal and a "black" information signal alternately multiplex driving, a pixel after writing on the signal electrode is supplied with a voltage of same polarity for a period of $4\Delta t$ or longer ($\Delta t$: a period for applying a writing voltage), whereby a written state of the pixel after writing (e.g., "white") can be inverted to the other written state (e.g., "black").

SUMMARY OF THE INVENTION

An object of the present invention is to provide a driving method for an optical modulation device having solved the problems encountered in the conventional liquid crystal display devices or optical shutters.

According to a first aspect of the present invention, there is provided a driving method for an optical modulation device comprising scanning electrodes and signal electrodes disposed opposite to and intersecting with the signal electrodes, and an optical modulation material disposed between the scanning electrodes and the signal electrodes, a pixel being formed at each intersection of the scanning electrodes and the signal electrodes and showing a contrast depending on the polarity of a voltage applied thereto; the driving method comprising, in a writing period for writing in all or prescribed pixels among the pixels on a selected scanning electrode among the scanning electrodes:

a first phase for applying a voltage of one polarity having an amplitude exceeding a first threshold voltage of the optical modulation material to the all or prescribed pixels, and a third phase for applying a voltage of the other polarity having an amplitude exceeding a second threshold voltage of the optical modulation material to a selected pixel and applying a voltage not exceeding the threshold voltages of the optical modulation material to the other pixels, respectively among the all or prescribed pixels, a second phase not determining the contrast of the all or prescribed pixels being further disposed between the first and third phases.

According to a second aspect of the present invention, there is provided a driving method of an optical modulation device as described above, which driving method comprises, in a writing period for writing in all or prescribed pixels among the pixels on a selected scanning electrode among the scanning electrodes:

a first phase for applying a voltage of one polarity having an amplitude exceeding a first threshold voltage of the optical modulation material to a nonselected pixel among the all or prescribed pixels, a second phase for applying a voltage of said one polarity having an amplitude exceeding the first threshold voltage to a selected pixel among the all or prescribed pixels, and a third phase for applying a voltage of the other polarity having an amplitude exceeding a second threshold voltage of the optical modulation material to the selected pixel.

According to a third aspect of the present invention, there is provided a driving method for an optical modulation device as described above, which comprises:

writing into all prescribed pixels on a selected scanning electrode among the scanning electrodes in a writing period including at least three phases, and applying voltages of mutually opposite polarities at the first phase and the last phase among the at least three phases and each having an amplitude not exceeding the threshold voltages of the optical modulation material to the pixels on a nonselected scanning electrode.

According to a fourth aspect of the present invention, there is provided a driving method for an optical modulation device as described above, which comprises:

a first step of applying a voltage of one polarity exceeding a first threshold voltage of the optical modulation material to all or a prescribed number of the pixels arranged in a matrix, and a second step including a second phase for applying a voltage of the other polarity exceeding a second threshold voltage of the optical modulation material to a selected pixel on a selected scanning electrode among the scanning electrodes so as to determine the contrast of the selected pixel, and a first phase for not determining the contrast of the selected pixel disposed prior to the second phase.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 shows threshold characteristic curves of ferroelectric liquid crystals;

FIGS. 5A-5D, FIGS. 8A-8D, FIGS. 11A-11D, FIGS. 14A-14D, FIGS. 17A-17D, FIGS. 20A-20D, and FIGS. 23A-23D respectively show voltage waveforms of signals applied to electrodes;

FIGS. 7, 10, 13, 16, 19, 22 and 25 show voltage waveforms of the above signals applied and expressed in time series;

FIGS. 28A-28D are voltage waveforms applied to pixels in a writing step; FIGS. 30A-30D show another set of voltage waveforms applied in a whole area-clearing step.

DESCRIPTION OF THE PREFERRED EMBODIMENTS

As an optical modulation material used in a driving method according to the present invention, a material showing at least two stable states, particularly one showing either a first optically stable state or a second optically stable state depending upon an electric field applied thereto, i.e., bistability with respect to the applied electric field, particularly a liquid crystal having the abovementioned property, may suitably be used.

Preferable liquid crystals having bistability which can be used in the driving method according to the present invention are chiral smectic liquid crystals having ferroelectricity. Among them, chiral smectic C (SmC*)- or H (SmH*)-phase liquid crystals are suitable therefor. These ferroelectric liquid crystals are described in, e.g., "LE JOURNAL DE PHYSIQUE LETTRES"36 (L-69), 1975 "Ferroelectric Liquid Crystals"; "Applied Physics Letters"36 (11) 1980, "Submicro Second Bistable Electrooptic Switching in Liquid Crystals", "Kotai Butsuri (Solid State Physics)" 16 (141), 1981 "Liquid Crystal", etc. Ferroelectric liquid crystals disclosed in these publications may be used in the present invention.

More particularly, examples of ferroelectric liquid crystal compound, used in the method according to the present invention are decyloxybenzylidene-p'-amino-2-methylbutyl-cinnamate (DOBAMBC), hexyloxybenzylidene-p'-amino-2-chloropropylcinnamate (HOBACPC), L 4-o-(2-methyl)-butylresorcylidene-4'-octylaniline (MBRA8), etc.

When a device is constituted by using these materials, the device may be supported with a block of copper, etc., in which a heater is embedded in order to realize a temperature condition where the liquid crystal compounds assume an SmC*- or SmH*-phase.

Further, a ferroelectric liquid crystal formed in chiral smectic F phase, I phase, J phase, G phase or K phase may also be used in addition to those in SmC* or SmH* phase in the present invention.

Figure 2:
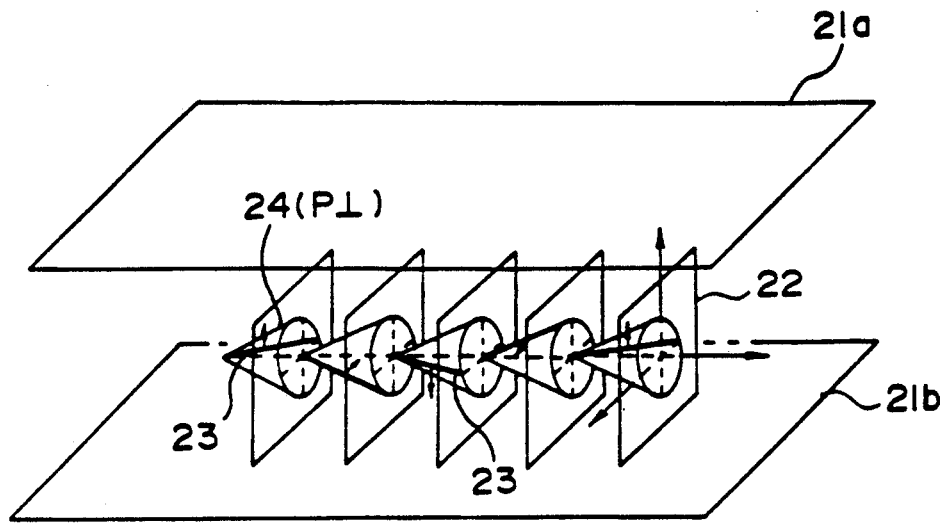
FIGS. 2 and 3 are schematic perspective views for illustrating the operational principles of a ferroelectric liquid crystal device used in the present invention.
Figure 3:
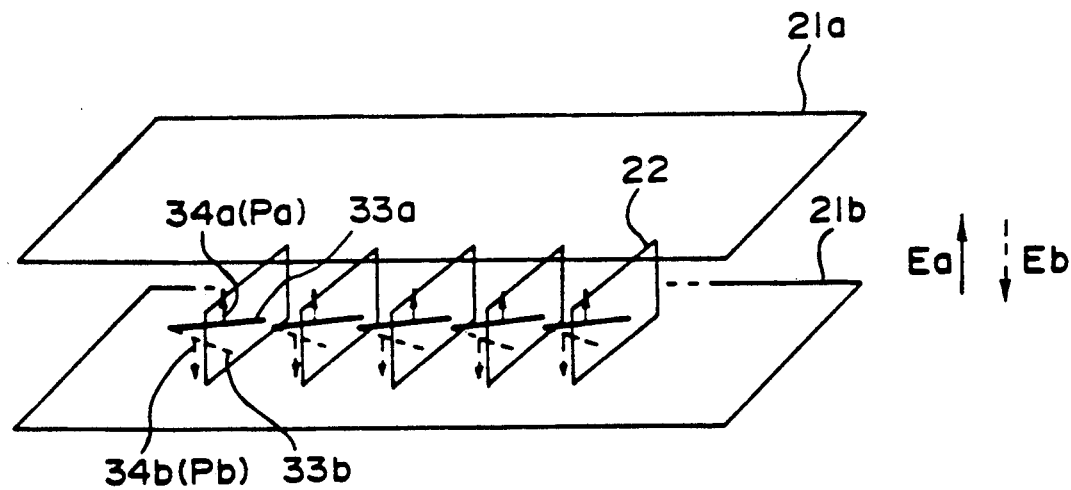

Referring to FIG. 2, there is schematically shown an example, of a ferroelectric liquid crystal cell. Reference numerals 21a and 21b denote substrates (glass plates) on which a transparent electrode of, e.g., $In_2O_3$, $SnO_2$, ITO (Indium Tin Oxide), etc., is disposed, respectively. A liquid crystal of an SmC*-phase in which liquid crystal molecular layers 22 are oriented perpendicular to surfaces of the glass plates is hermetically disposed therebetween. A full line 23 shows liquid crystal molecules. Each liquid crystal molecule 23 has a dipole moment ($P_\perp$) 24 in a direction perpendicular to the axis thereof. When a voltage higher than a certain threshold level is applied between electrodes formed on the substrates 21a and 21b, the helical structure of the liquid crystal molecule 23 is unwound or released to change the alignment direction of respective liquid crystal molecules 23 so that the dipole moments (P⊥) 24 are all directed in the direction of the electric field. The liquid crystal molecules 23 have an elongated shape and show refractive anisotropy between the long axis and the short axis thereof. Accordingly, it is easily understood that when, for instance, polarizers arranged in a cross nicol relationship, i.e., with their polarizing directions crossing each other, are disposed on the upper and the lower surfaces of the glass plates, the liquid crystal cell thus arranged functions as a liquid crystal optical modulation device whose optical characteristics vary depending upon the polarity of an applied voltage. Further, when the thickness of the liquid crystal cell is sufficiently thin (e.g., 1 μ), the helical structure of the liquid crystal molecules is unwound without the application of an electric field whereby the dipole moment assumes either of the two states, i.e., Pa in an upper direction 34a or Pb in a lower direction 34b as shown in FIG. 3. When an electric field Ea or Eb, higher than a certain threshold level and different from each other in polarity as shown in FIG. 3 is applied to a cell having the above-mentioned characteristics, the dipole moment is directed either in the upper direction 34a or in the lower direction 34b depending on the vector of the electric field Ea or Eb. In correspondence with this, the liquid crystal molecules are oriented to either a first stable state 33a or a second stable state 33b.

When the above-mentioned ferroelectric liquid crystal is used as an optical modulation element, it is possible to obtain two advantages. First, the response speed is quite fast. Second, the orientation of the liquid crystal shows bistability. The second advantage will be further explained, e.g., with reference to FIG. 3. When the electric field Ea is applied to the liquid crystal molecules, they are oriented to the first stable state 33a. This state is stably retained even if the electric field is removed. On the other hand, when the electric field Eb whose direction is opposite to that of the electric field Ea is applied thereto, the liquid crystal molecules are oriented to the second stable state 33b, whereby the directions of the molecules are changed. Likewise, the latter state is stably retained even if the electric field is removed. Further, as long as the magnitude of the electric field Ea or Eb being applied is not above a certain threshold value, the liquid crystal molecules are placed in the respective orientation states. In order to effectively realize high response speed and bistability, it is preferable that the thickness of the cell is as thin as possible and generally 0.5 to 20 μ, particularly 1 to 5 μ.

In a preferred embodiment according to the present invention, there is provided a liquid crystal device comprising scanning electrodes which are sequentially and cyclically selected based on a scanning signal, signal electrodes which are disposed opposite to the scanning electrodes and selected based on a prescribed information signal, and a liquid crystal showing bistability in response to an electric field and disposed between the two types of electrodes. The liquid crystal device is driven by a method which comprises, in the period of selecting a scanning electrode, a first phase $t_1$ and a second phase $t_2$ for applying a voltage in one direction for orienting the liquid crystal to its second stable state (assumed to provide a "black" display state), and a third phase $t_3$ for applying a voltage in the other direction for re-orienting the liquid crystal to a first stable state (assumed to provide a "white" display state) depending on the electric signal applied to a related signal electrode.

A preferred embodiment of the driving method according to the present invention will now be explained with reference to FIGS. 4 and 7.

Figure 4:
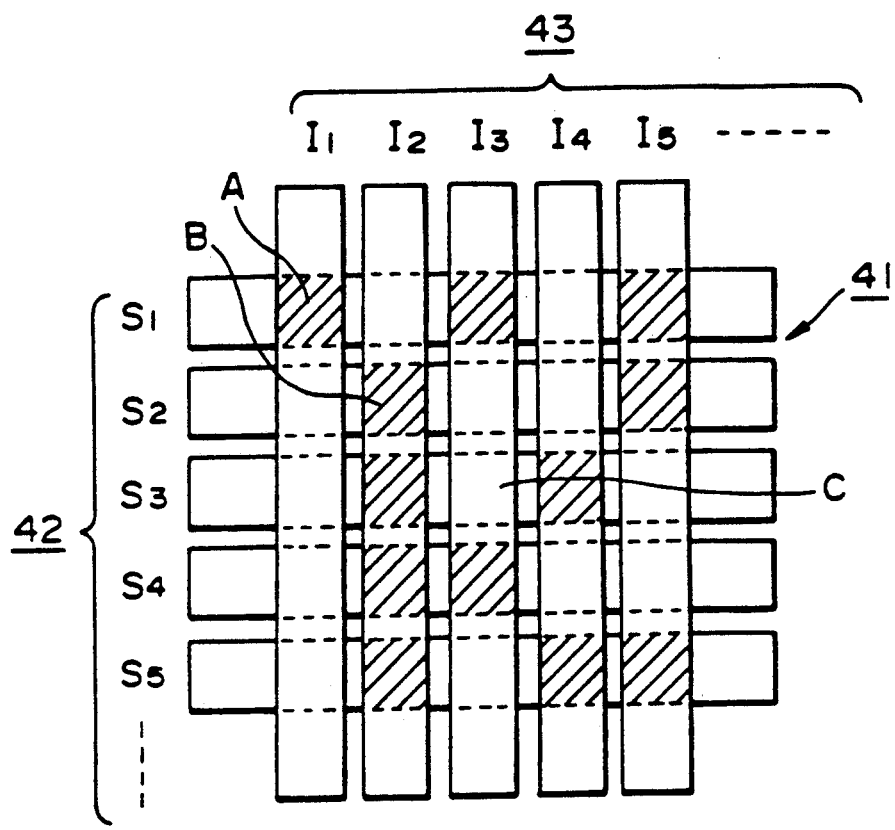
FIG. 4 is a plan view of a matrix pixel arrangement used in the present invention.
Figure 5A:
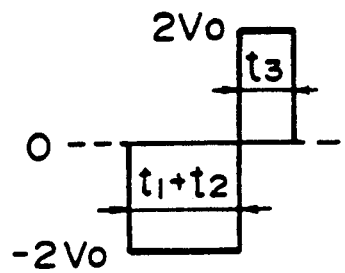
Figure 5B:
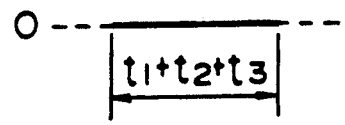
Figure 5C:
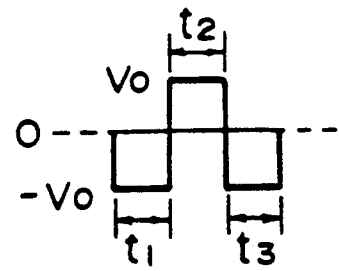
Figure 5D:
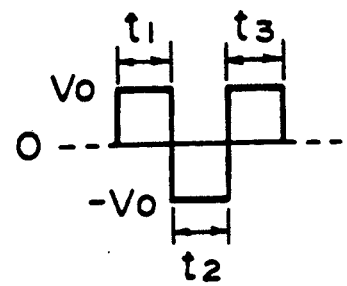

Referring to FIG. 4, there is schematically shown an example of a cell 41 having a matrix electrode arrangement in which a ferroelectric liquid crystal (not shown) is interposed between scanning electrodes 42 and signal electrodes 43. For brevity of explanation, the case where binary states of "white" and "black" are displayed will be explained. In FIG. 4, the hatched pixels are assumed to be displayed in "black" and the other pixels, in "white". FIGS. 5A and 5B show a scanning selection signal applied to a selected scanning electrode and a scanning nonselection signal applied to the other scanning electrodes (nonselected scanning electrodes), respectively. FIGS. 5C and 5D show an information selection signal applied to a selected signal electrode and an information non-selection signal applied to a nonselected signal electrode. In FIGS. 5A–5D, the abscissa and the ordinate represent time and voltage, respectively.

Figure 6A:
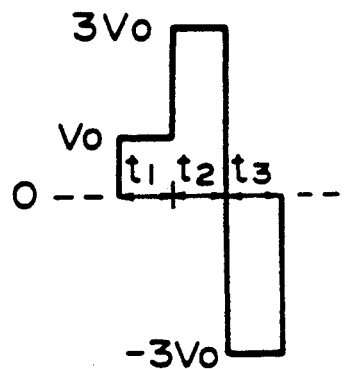
FIGS. 6A-6D, FIGS. 9A-9D, FIGS. 12A-12D, FIGS. 15A-15D, FIGS. 18A-18D, FIGS. 21A-21D, and FIGS. 24A-24D respectively show voltage waveforms of signals applied to pixels.

FIG. 6A shows a voltage waveform applied to a pixel on a selected scanning electrode line and on a selected signal electrode line, whereby the pixel is written in "white".

Figure 6B:
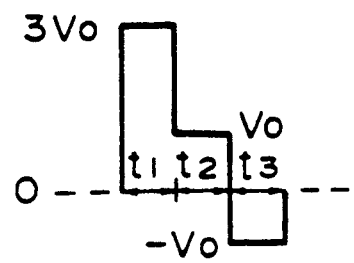

FIG. 6B shows a voltage waveform applied to a pixel on a selected scanning electrode line and on a nonselected signal electrode line, whereby the pixel is written in "black".

Figure 6C:
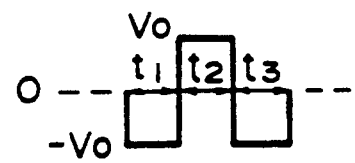
Figure 6D:
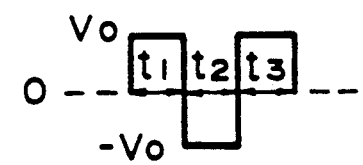

FIG. 6C shows a voltage waveform applied to a pixel on a nonselected scanning electrode line and on a selected signal electrode line, and FIG. 6D shows a voltage waveform applied to a pixel on a nonselected scanning electrode line and on a nonselected signal electrode line. Further, FIG. 7 shows the above voltage waveforms shown in time series.

According to the driving method of the present invention, during a writing period (phases $t_1+t_2+t_3$) for writing in the pixels on a selected scanning electrode line among the matrix pixel arrangement, all or a prescribed part of the pixels on the line are brought to one display state in at least one of the phases $t_1$ and $t_2$, and then only a selected pixel is inverted to the other display state, whereby one line is written. Such a writing operation is sequentially repeated with respect to the scanning electrode lines to effect writing of one whole picture.

Now, if a first threshold voltage for providing a first stable state (assumed to provide a "white" state) of a bistable ferroelectric liquid crystal device for an application time of Δt (writing pulse duration) is denoted by $-V_{th1}$, and a second threshold voltage for providing a second stable state (assumed to provide a "black" state) for an application time Δt is denoted by $+V_{th2}$, an electrical signal applied to a selected scanning electrode has voltage levels of $-2V_0$ at phase (time) $t_1$, $-2V_0$ at phase $t_2$ and $2V_0$ at phase $t_3$ as shown in FIG. 5A. The other scanning electrodes are grounded and placed in a 0 voltage state as shown in FIG. 5B. On the other hand, an electrical signal applied to a selected signal electrode has voltage levels of $-V_0$ at phase $t_1$, $V_0$ at phase $t_2$ and again $V_0$ at phase $t_3$ as shown in FIG. 5C. Further, an electrical signal applied to a nonselected signal electrode has voltage levels of $V_0$ at phase $t_1$, $-V_0$ at phase $t_2$ and $V_0$ at phase $t_3$.

In this way, both the voltage waveform applied to a selected signal electrode and the voltage waveform applied to a nonselected signal electrode, alternate corresponding to the phases $t_1$, $t_2$ and $t_3$, and the respective alternating waveforms have a phase difference of 180° from each other.

In the above, the respective voltage values are set to desired values satisfying the following relationships:

$$V_0 < V_{th2} < 3V_0, \text{ and}$$

$$-3V_0 < -V_{th1} < -V_0.$$

Voltage waveforms applied to respective pixels when the above electrical signals are applied, are shown in FIGS. 6A-6D.

As shown in FIG. 6A, a pixel on a selected scanning electrode line and on a selected signal electrode line is supplied with a voltage of $3V_0$ exceeding the threshold $V_{th2}$ at phase $t_2$ to assume a "black" display state based on the second stable state of the ferroelectric liquid crystal, and then in the subsequent phase $t_3$, is supplied with a voltage of $-3V_0$ exceeding the threshold $-V_{th1}$ to be written in a "white" display state based on the first stable state of the ferroelectric liquid crystal. Further, as shown in FIG. 6B, a pixel on a selected scanning electrode line and on a nonselected signal electrode line is supplied with a voltage of $3V_0$ exceeding the threshold $V_{th2}$ at phase $t_1$ to assume a "black" display state, and then in the subsequent phases $t_2$ and $t_3$, is supplied with $V_0$ and $-V_0$ below the thresholds, so that the pixel is written in a black display state.

Figure 7:
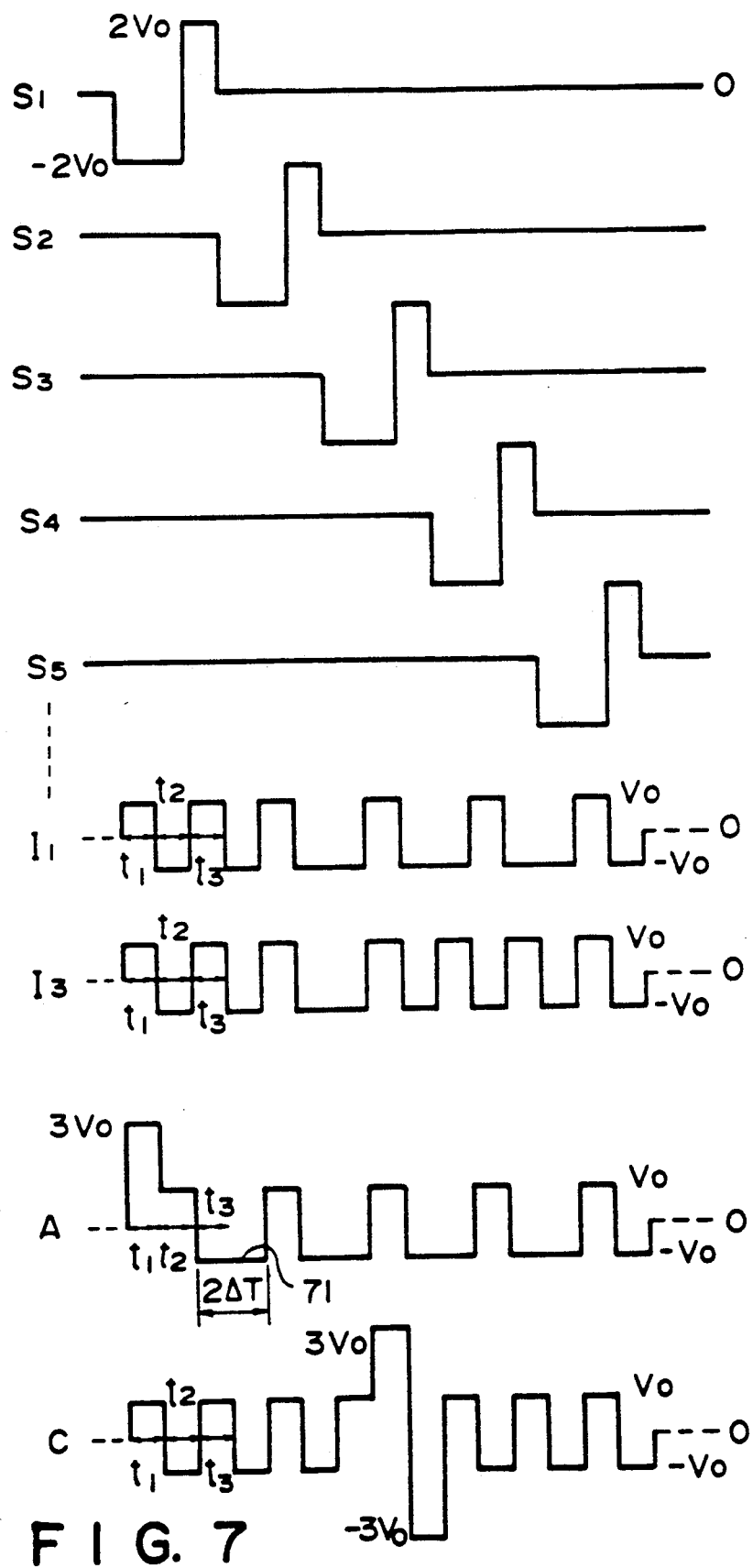

FIG. 7 shows the above mentioned driving signals expressed in a time series. Electrical signals applied to scanning electrodes are shown at $S_1$-$S_5$, electrical signals applied to signal electrodes are shown at $I_1$ and $I_3$, and voltage waveforms applied to pixels A and C in FIG. 4 are shown at A and C.

Now, the significance of the intermediate phase $t_2$ will be explained in some detail. The microscopic mechanism of switching due to electric field of a ferroelectric liquid crystal under bistability condition has not been fully clarified. Generally speaking, however, the ferroelectric liquid crystal can retain its stable state semi-permanently, if it has been switched or oriented to the stable state by the application of a strong electric field for a pre-determined time and is left standing under absolutely no electric field. However, when a reverse polarity of an electric field is applied to the liquid crystal for a long period of time, even if the electric field is such a weak field (corresponding to a voltage below $V_{th}$ in the previous example) that the stable state of the liquid crystal is not switched in the predetermined time for writing, the liquid crystal can change its stable state to the other one, whereby correct display or modulation of information cannot be accomplished. We have recognized that the liability of such switching or reversal of oriented states under the long term application of a weak electric field is affected by a material and roughness of a base plate contacting the liquid crystal and the kind of liquid crystal, the effects have not been clarified quantitatively. We have confirmed a tendency that a uniaxial treatment of the substrate such as rubbing or oblique or tilt vapor deposition of SiO, etc., increases the liability of the above-mentioned reversal of oriented states. The tendency is manifested at a higher temperature compared to a lower temperature.

In order to accomplish correct display or modulation of information, it is advisable that an electric field of one direction be prevented from being applied to the liquid crystal for a long time.

In view of the above problem, in the above embodiment of the driving method according to the present invention, the pixels on a nonselected scanning electrode line are only supplied with a voltage waveform alternating between $-V_0$ and $V_0$ both below the threshold voltages as shown in FIGS. 6C and 6D, so that the liquid crystal molecules therein do not change their orientation states but keep providing the display states attained in the previous scanning. Further, as the voltages of $V_0$ and $-V_0$ are alternately repeated in the phases $t_1$, $t_2$ and $t_3$, the phenomenon of inversion to another stable state (i.e., crosstalk) due to continuous application of a voltage of one direction does not occur. Furthermore, in the present invention, the period wherein a voltage of $V_0$ (nonwriting voltage) is continually applied to a pixel A or C is $2\Delta T$ at the longest appearing at a wave portion 71 in the waveform shown at A. $\Delta T$ denotes a unit writing pulse, and each of the phases $t_1$, $t_2$ and $t_3$ has a pulse duration $\Delta T$ in this embodiment, so that the above mentioned inversion phenomenon can be completely prevented even if the voltage margin during driving (i.e., difference between writing voltage level ($3V_0$) and nonwriting voltage level ($V_0$)) is not widely set. Further, in this embodiment, one pixel is written in a total pulse duration of $3\Delta T$ including the phases $t_1$, $t_2$ and $t_3$, so that writing of one whole picture can be written at a high speed.

As described above, according to this embodiment, even when a display panel using a ferroelectric liquid crystal device is driven at a high speed, the maximum pulse duration of a voltage waveform continually applied to the pixels on the scanning electrode lines to which a scanning nonselected signal is applied, is suppressed to twice the writing pulse duration $\Delta T$, so that the phenomenon of one display state being inverted to another display state during writing of one picture frame may be effectively prevented.

Figure 9A:
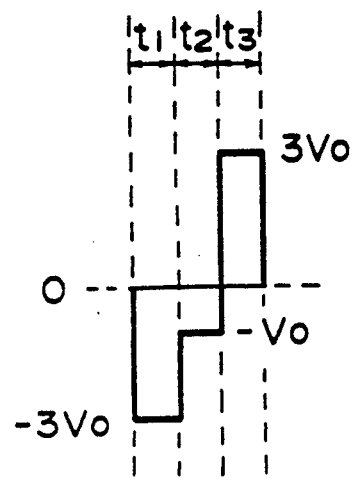
Figure 9B:
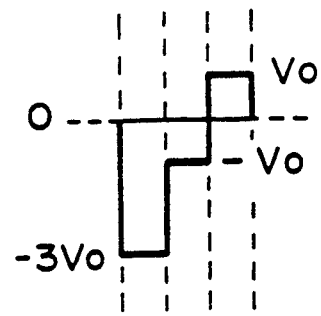
Figure 9C:
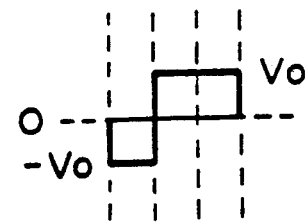
Figure 9D:
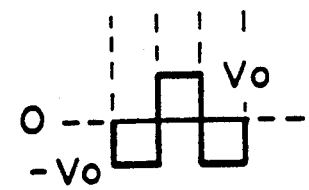
Figure 10:
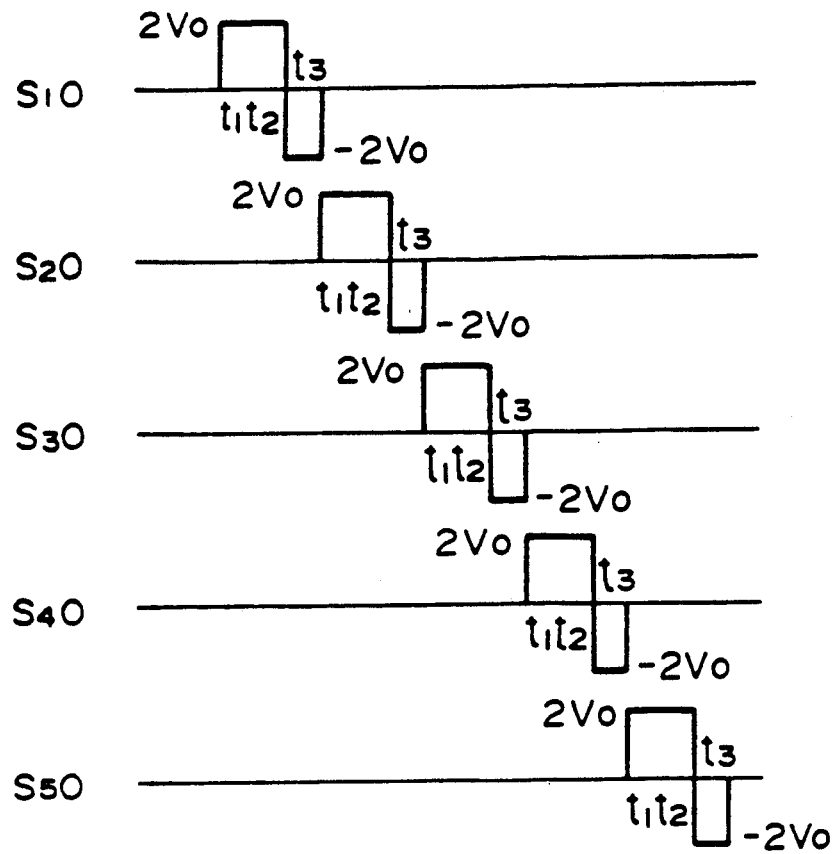
Figure 10:
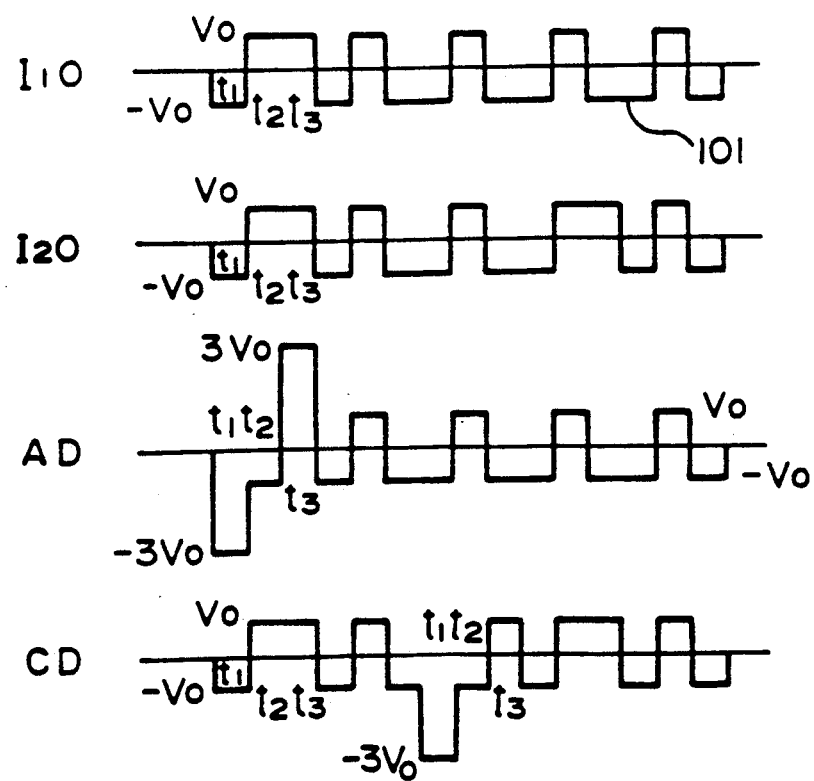

FIGS. 8-10 show another embodiment of the driving method according to the present invention.

FIGS. 8A and 8B show a scanning selection signal applied to a selected scanning electrode and a scanning non-selection signal applied to the other scanning electrodes (nonselected scanning electrodes), respectively. FIGS. 8C and 8D show an information selection signal applied to a selected signal electrode and an information non-selection signal applied to a nonselected signal electrode. The information selection signal and the information non-selection signal have mutually different waveforms, and have the same polarity in a first phase $t_1$. In FIGS. 8A-8D, the abscissa and the ordinate represent time and voltage, respectively. A writing period includes a first phase $t_1$, a third phase $t_2$ and a second phase $t_3$. In this embodiment, $t_1 = t_2 = t_3$. A writing period is sequentially provided to the scanning electrodes 42.

When $-V_{th1}$ and $V_{th2}$ are defined as in the previous example, an electrical signal applied to a selected scanning electrode has voltage levels of $2V_0$ at phase (time) $t_1$ and phase $t_2$, and $-2V_0$ at phase $t_3$ as shown in FIG. 8A. The other scanning electrodes are grounded and placed in a 0 voltage state as shown in FIG. 8B. On the other hand, an electrical signal applied to a selected signal electrode has voltage levels of $-V_0$ at phase $t_1$, and $V_0$ at phases $t_2$ and $t_3$ as shown in FIG. 8C. Further, an electrical signal applied to a nonselected signal electrode has voltage levels of $-V_0$ at phase $t_1$, $V_0$ at phase $t_2$ and $-V_0$ at phase $t_3$.

In the above, the respective voltage values are set to desired values satisfying the relationships of $V_0 < V_{th2} < 3V_0$, and $-3V_0 < -V_{th1} < -V_0$. Voltage waveforms applied to respective pixels when the above electric signals are applied, are shown in FIGS. 9A-9D.

FIGS. 9A and 9B show voltage waveforms applied to pixels for displaying "black" and "white", respectively, on a selected scanning electrodes. Further, FIGS. 9C and 9D show voltage waveforms respectively applied, to pixels on nonselected scanning electrodes. As is apparent in view of FIGS. 9A and 9B, all or a prescribed part of the pixels on a selected scanning electrode are supplied with a voltage of $-3V_0$ exceeding the threshold voltage $-V_{th1}$ at a first phase $t_1$ to be once uniformly brought to "white". This phase is referred to as an erasure phase. Among these pixels, a pixel to be displayed in "black" is supplied with a voltage $3V_0$ exceeding the threshold voltage $V_{th2}$, so that it is inverted to the other optically stable state ("black"). This is referred to as a display selection phase. Further, pixels for displaying "white" are supplied with a voltage $V_0$ not exceeding the threshold voltage $-V_{th}$ at the third phase $t_3$, so that it remains in the one optically stable state (white).

On the other hand, all the pixels on a non-selected scanning electrode are supplied with a voltage of $\pm V_0$ or 0, each not exceeding the threshold voltages. As a result, the liquid crystal molecules therein do not change their orientation states but retain orientation states corresponding to the display states resulted in the time of last scanning. Thus, when a scanning electrode is selected, the pixels thereon are once uniformly brought to one optically stable state (white), and then at the third phase, selected pixels are shifted to the other optically stable state (black), whereby one line of signal states are written, which are retained until the line is selected next time.

FIG. 10 shows the above mentioned driving signals expressed in a time series. Electrical signals applied to scanning electrodes are shown at $S_1-S_5$, electrical signals applied to signal electrodes are shown at $I_1$ and $I_3$, and voltage waveforms applied to pixels A and C in FIG. 4 are shown at A and C.

At the time of scanning in the driving method, the pixels on a scanning electrode concerned are once uniformly brought to "white" at a first phase $t_1$, and then at a third phase $t_3$, selected pixels are rewritten into "black". In this embodiment, the voltage for providing "white" at the first phase $t_1$ is $-3V_0$, and the application period thereof is $\Delta t$. On the other hand, the voltage for rewriting into "black" is $3V_0$, and the application period thereof is $\Delta t$. Further, the voltage applied to the pixels at time other than the time of scanning is $|\pm V_0|$ at the maximum. The longest period wherein the voltage is continuously applied is $2\Delta t$ as appearing at 101 shown in FIG. 10, because a second phase, i.e., an auxiliary phase (auxiliary signal application phase) for applying an auxiliary signal not determining a display state of a pixel, is provided. As a result, the above mentioned crosstalk phenomenon does not occur at all, and when scanning of one whole picture frame is once completed, the displayed information is semipermanently retained, so that a refreshing step as required for a display device using a conventional TN liquid crystal having no bistability is not required at all. Furthermore, according to this embodiment, the period wherein a particular voltage is applied is $2\Delta t$ at the maximum, so that the driving voltage margin can be flexibly set without causing an inversion phenomenon.

As may be understood from the above description, the term "display (contrast) selection phase" or "display (contrast) determining phase" used herein means a phase which determines one display state of a selected pixel, a bright state or dark state, and which is the last phase such that a voltage having an amplitude exceeding a threshold voltage of a ferroelectric liquid crystal is applied, during a writing period for the pixels on a selected scanning line. More specifically, in the embodiment of FIG. 8, the phase $t_3$ is a phase wherein a black display state, for example, is determined with respect to a selected pixel among the respective pixels on a scanning electrode line, and corresponds to a "display state selection phase".

Further, the term "auxiliary phase" described herein means a phase for applying an auxiliary signal not determining the display state of a pixel and a phase other than the display state selection phase and the erasure phase. More specifically, the phase $t_2$ in FIG. 8 corresponds to the auxiliary phase.

Example 1

On each of a pair of glass plates provided thereon with transparent conductor fills patterned so as to provide a matrix of 500×500 intersections, an about 300 Å-thick polyimide film was formed by spinner coating. The respective substrates were treated by rubbing with a roller about which a cotton cloth was wound and superposed with each other so that their rubbing directions coincided with each other to form a cell with a spacing of about 1.6 μ. Into this cell was injected a ferroelectric liquid crystal DOBAMBC (decyloxybenzylidene-p'-amino-2-methylbutylcinnamate) under heating, which was then gradually cooled to form a uniform monodomain of SmC* phase. The cell was controlled at a temperature of 70° C. and subjected to a line sequential driving method as explained with reference to FIGS. 8-10 wherein the respective values were set to $V_0=10$ volts, and $t_1=t_2=t_3=\Delta t=50$ μsec., whereby a very good image was obtained.

A driving embodiment further improved over the above described embodiment is explained with reference to FIGS. 11-13.

Figure 11A:
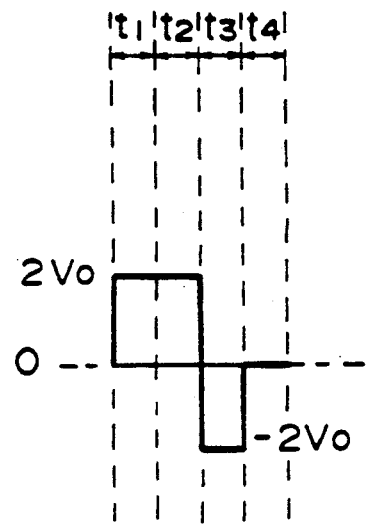
Figure 11B:
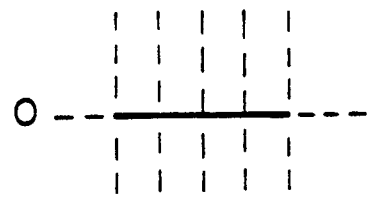
Figure 11C:
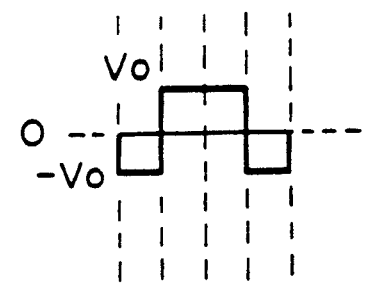
Figure 11D:
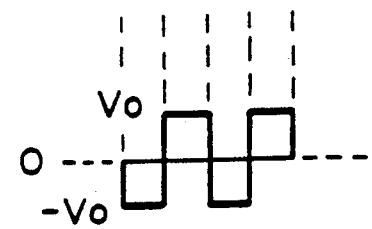
Figure 12A:
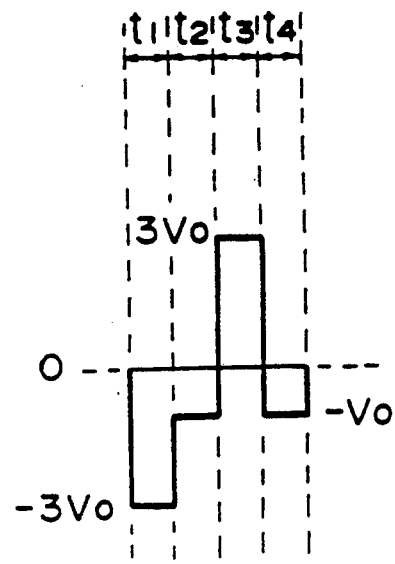
Figure 12B:
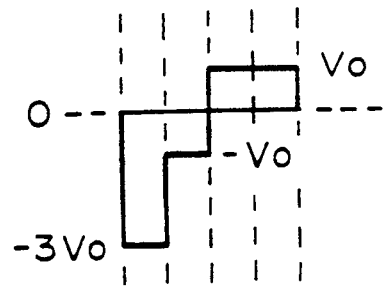
Figure 12C:
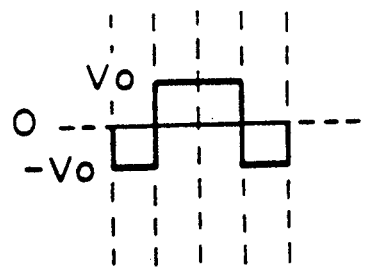
Figure 12D:
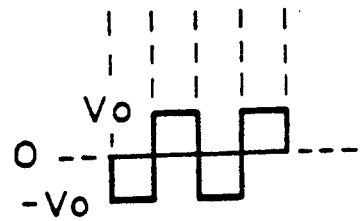

FIGS. 11A and 11B show a scanning selection signal applied to a selected scanning electrode and a scanning non-selection signal applied to the other scanning electrodes (nonselected scanning electrodes), respectively. Phases $t_1$ and $t_3$ correspond to the above mentioned erasure phase and display state selection phase, respectively. Phase $t_2$ is an auxiliary phase (auxiliary signal application phase). These are the same as used in the previous driving embodiment. In this driving embodiment, an additional auxiliary phase not determining the display state of a pixel is provided as a fourth phase $t_4$. In the fourth phase $t_4$, a voltage of 0 volts is applied to all the scanning electrode lines, and the signal electrodes are supplied with a voltage of $\pm V_0$ having a polarity opposite to the voltage applied at the third phase $t_3$.

Figure 13:
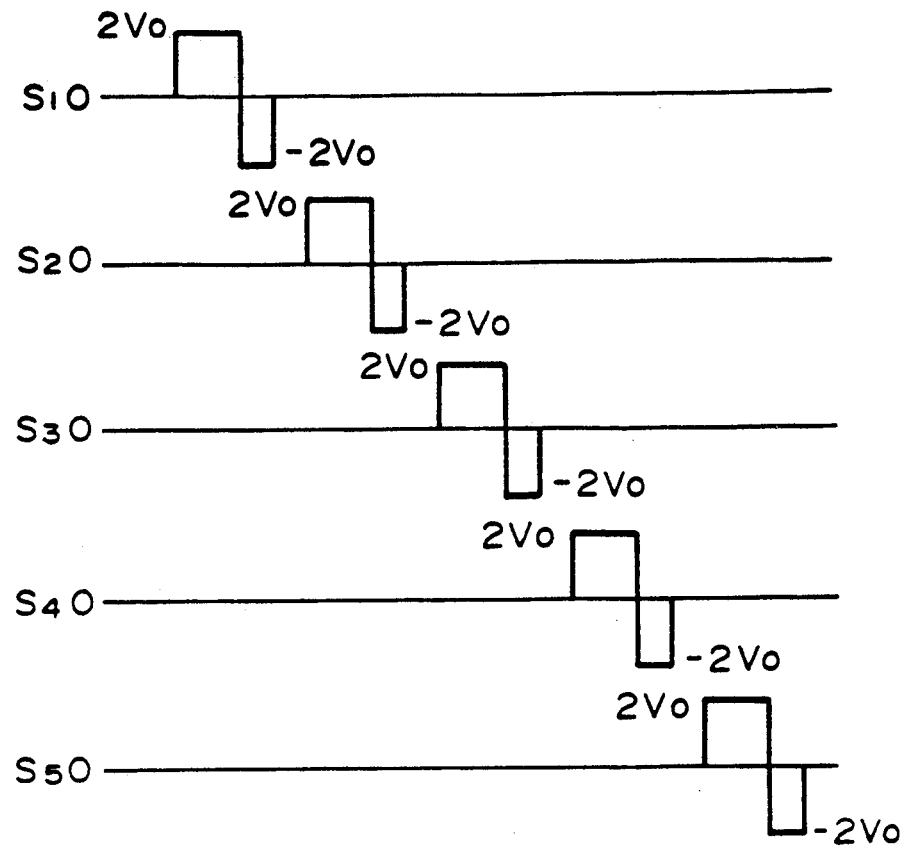
Figure 13:
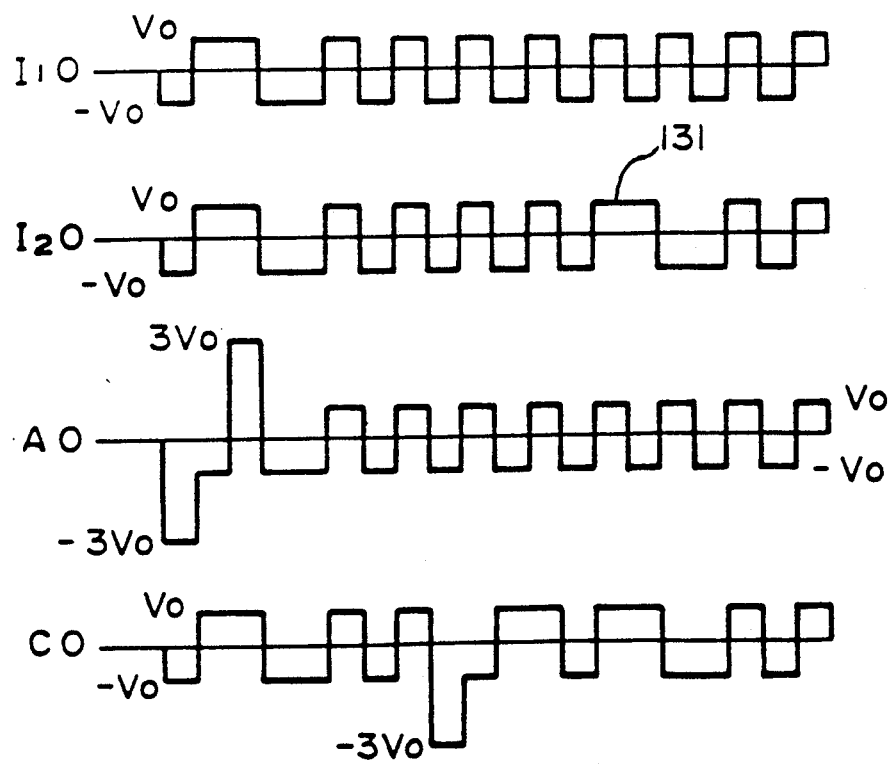

The voltage applied to the respective pixels at the time of non-selection is $|\pm V_0|$ at the maximum, and the longest period for which the voltage $\pm V_0$ is applied is $2\Delta t$ at a part $|3|$ shown in FIG. 13 because of the application of the auxiliary signals at phases $t_2$ and $t_4$. Furthermore, the frequency of the occurrence of such 2Δt period is small, and the voltage applied for the Δt period alternates to weaken the voltage applied to the respective pixels at the time of non-selection, so that no crosstalk occurs at all. Then, when scanning of one whole picture is once completed, the displayed information is semipermanently retained, so that a refreshing step, as required for a display device using a conventional TN liquid crystal having no bistability, is not required at all.

Further, in the present invention, it is possible that the above mentioned phase $t_4$ is placed before the phase $t_1$.

Figure 15A:
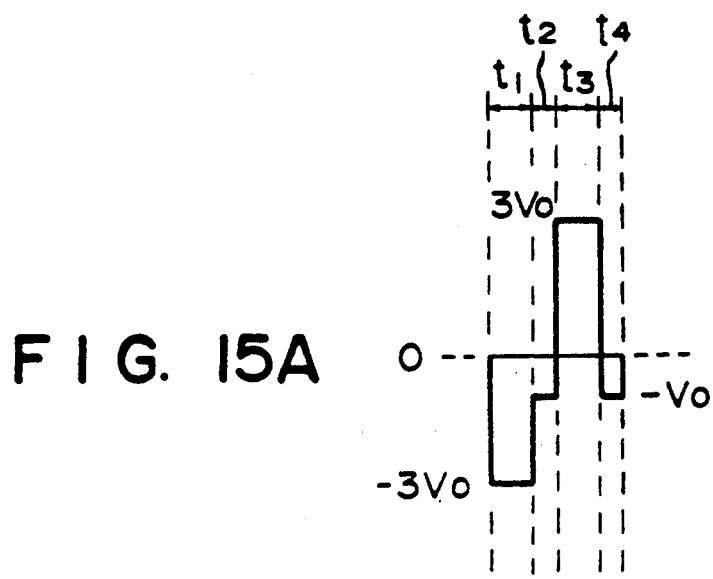
Figure 15B:
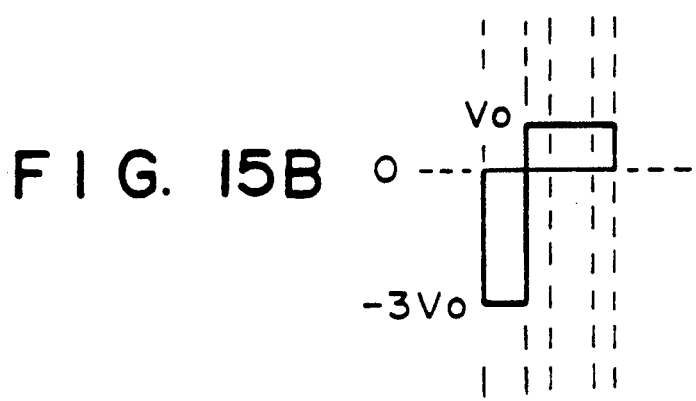
Figure 15C:
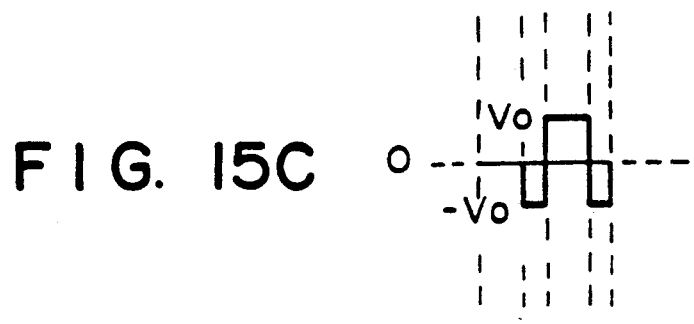
Figure 15D:
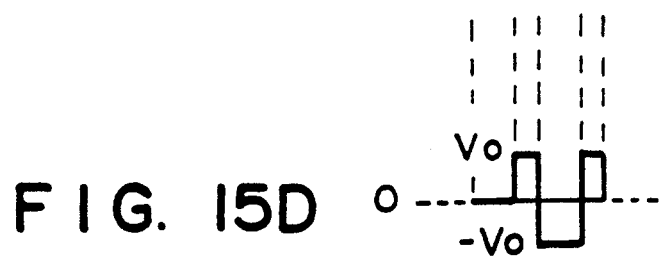
Figure 16:
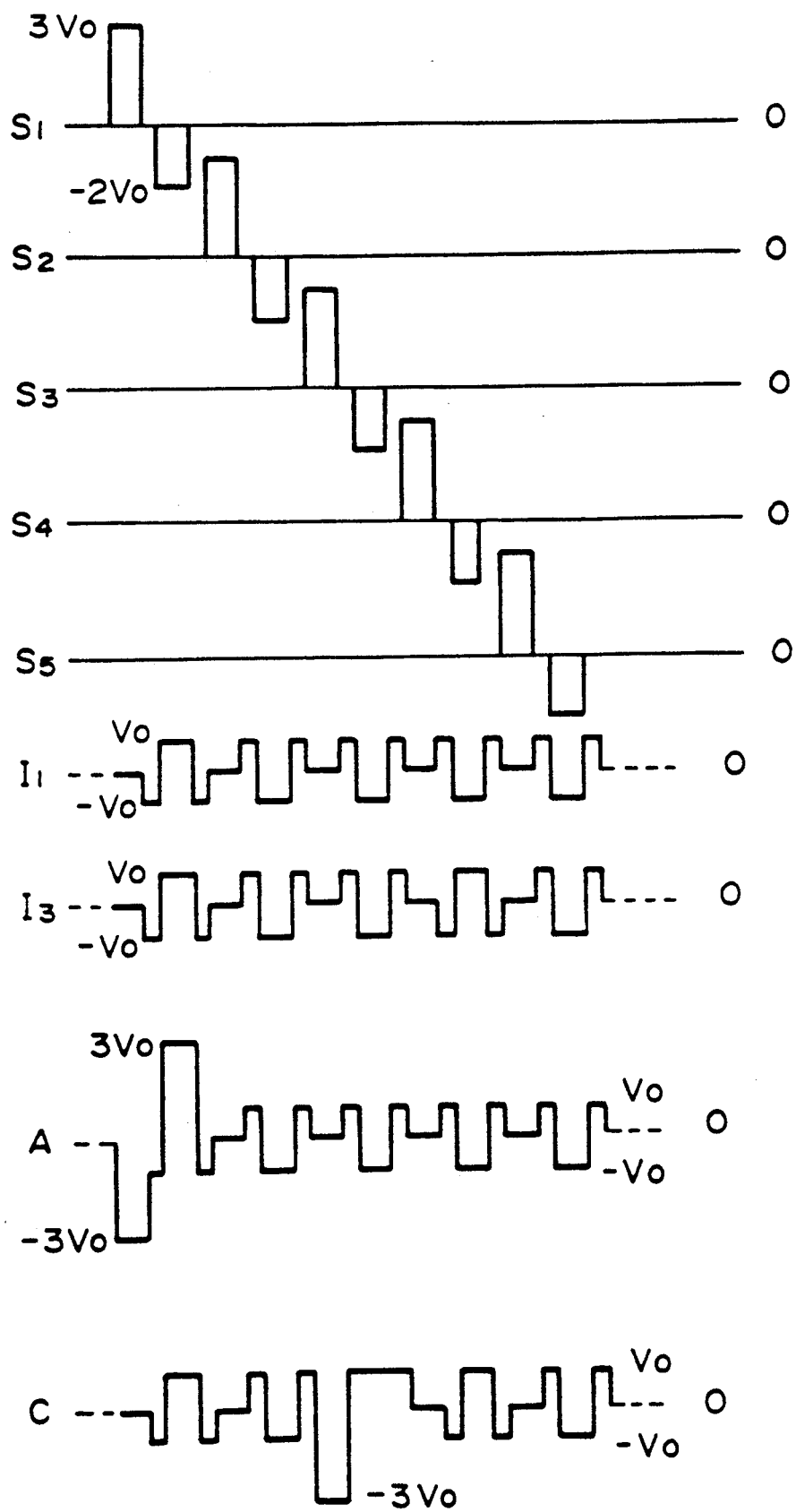
Figure 17A:
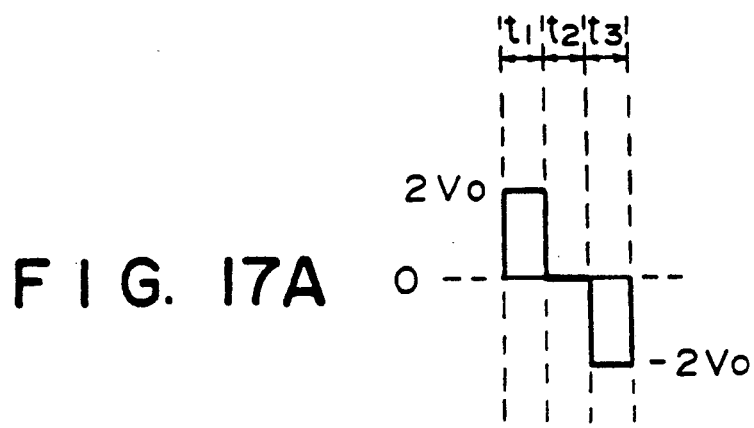
Figure 17B:
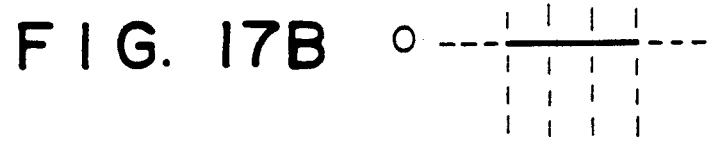
Figure 17C:
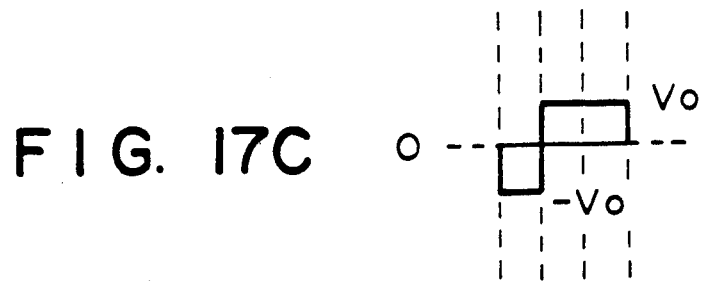
Figure 17D:
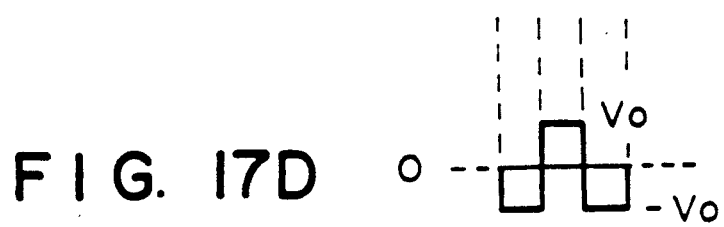

FIGS. 14-16 show another embodiment of the present invention. FIGS. 14A and 14B show a scanning selection signal applied to a selected scanning electrode and a scanning non-selection signal applied to the other scanning electrodes (nonselected scanning electrodes), respectively. Phases $t_1$ and $t_3$ correspond to the erasure phase and display state selection phase, respectively. Phases $t_2$ and $t_4$ are auxiliary phases for applying an auxiliary signal not determining a display state.

Figure 14A:
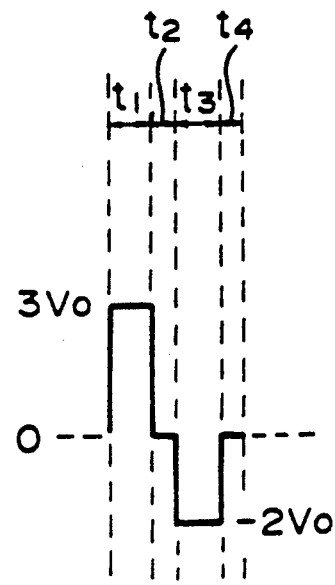
Figure 14B:
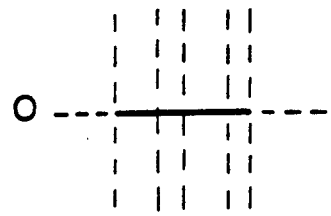
Figure 14C:
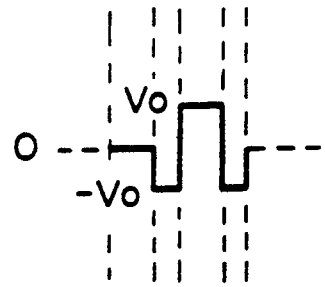
Figure 14D:
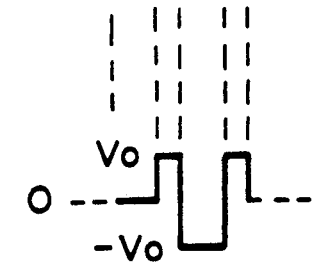

A scanning selection signal applied to a selected scanning electrode has a voltage waveform showing $3V_0$ at phase $t_1$, 0 at phase $t_2$, $-2V_0$ at phase $t_3$, and 0 at phase $t_4$ as shown in FIG. 14A. The other scanning electrodes are grounded as shown in FIG. 14B and the applied electric signal is 0. On the other hand, a selected signal electrode is supplied with an information selection signal as shown in FIG. 14C, which shows 0 at phase $t_1$, $-V_0$ at phase $t_2$, $+V_0$ at phase $t_3$, and $-V_0$ at phase $t_4$. Further, a non-selected signal electrode is supplied with an information nonselection signal as shown in FIG. 14D, which shows 0 at phase $t_1$, $+V_0$ at phase $t_2$, $-V_0$ at phase $t_3$ and $\pm V_0$ at phase $t_4$. The lengths of the respective phases are set to satisfy $t_1=t_3$, $t_2=t_4$, and $\frac{1}{2}\cdot t_1 = t_2$. In the above, the voltage value $V_0$ is set in the same manner as in the previous examples. FIG. 15 shows voltage waveforms applied to respective pixels, when such electrical signals are applied.

FIGS. 15A and 15B show voltage waveforms applied to pixels for displaying "black" and "white", respectively, on a selected scanning electrode. Further, FIGS. 15C and 15D show voltage waveforms respectively applied to pixels on nonselected scanning electrodes. All or a prescribed part of the pixels are once uniformly brought to "white" at a first phase $t_1$ as in the previous examples. Among these, a pixel for displaying "black" is brought to "black" based on the other optically stable state at a third phase $t_3$. Further, on the same scanning electrode, a pixel for displaying "white" is supplied with a voltage of $V_0$ not exceeding the threshold voltage $V_{th1}$ at the phase $t_3$, so that it remains in one optically stable state.

On the other hand, on the nonselected scanning electrode, all the pixels are supplied with a voltage of $\pm V_0$ or 0 not exceeding the threshold voltages, as in the previous examples. As a result, the liquid crystal molecules therein do not change their orientation states but retain orientation states corresponding to the display states resulted in the time of last scanning. Thus, when a scanning electrode is selected, the pixels thereon are once uniformly brought to one optically stable state (white), and then at the third phase, selected pixels are shifted to the other optically stable state (black), whereby one line of signal states are written, which are retained until the line is selected next time.

FIG. 16 shows the above mentioned driving signals expressed in time series. Electrical signals applied to scanning electrodes are shown at $S_1$-$S_5$, electrical signals applied to signal electrodes are shown at $I_1$ and $I_3$, and voltage waveforms applied to pixels A and C in FIG. 4 are shown at A and C.

In this embodiment, the voltage for providing "white" at the first phase $t_1$ is $-3-V_0$, and the application period thereof is Δt. On the other hand, the voltage for rewriting into "black" is again $3V_0$, and the application period thereof is Δt. Further, the voltage applied to the pixels at time other than the time of scanning is $|V\pm_0|$ at the maximum. The longest period wherein the voltage is continuously applied is 2.5Δt even when white-white signals are continued, because of the auxiliary signals applied at the phases $t_2$ and $t_4$. Further, a smaller weak voltage is applied to the respective pixels, so that no crosstalk occurs at all, and when the scanning of one whole picture frame is once completed, the resultant displayed information is retained semipermanently.

Figure 18A:
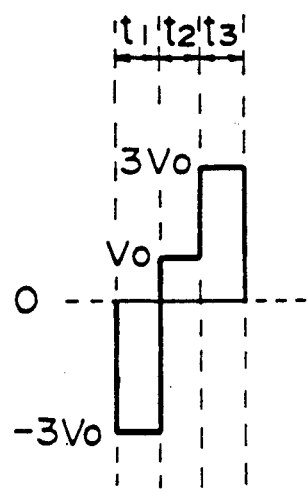
Figure 18B:
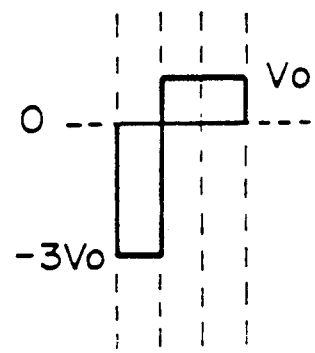
Figure 18C:
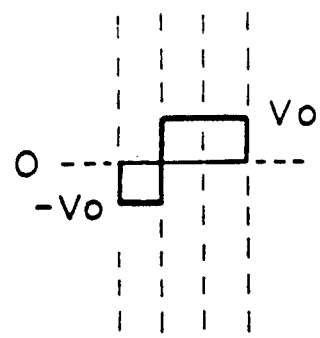
Figure 18D:
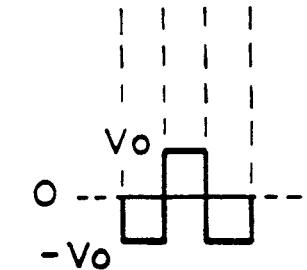
Figure 19:
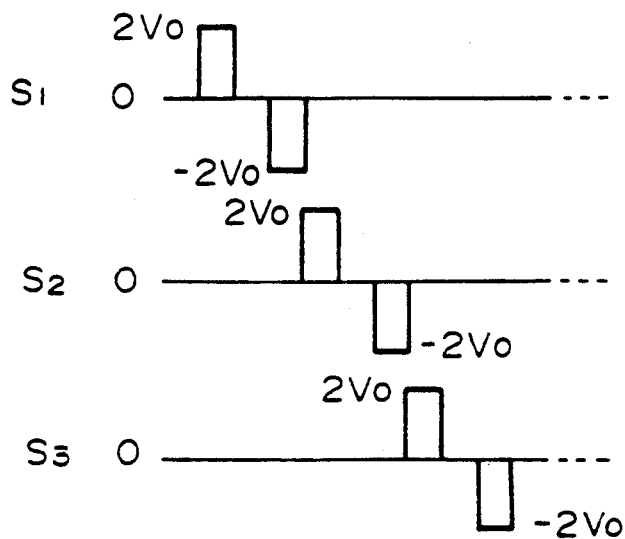
Figure 19:
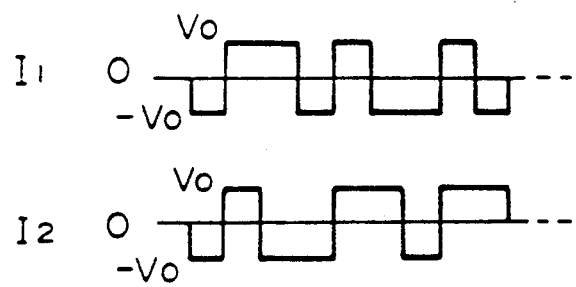
Figure 19:
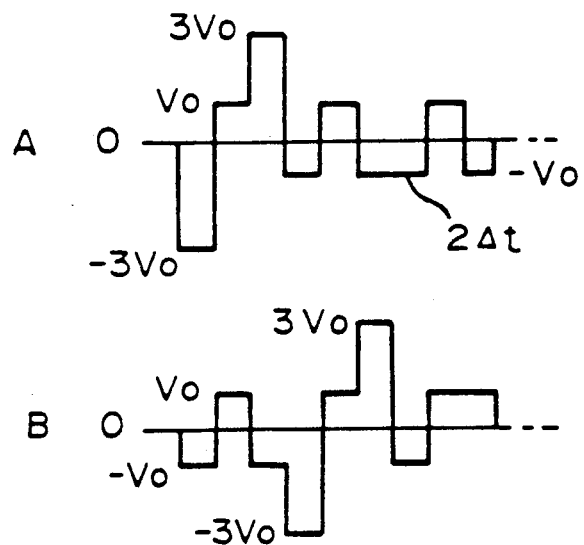

FIGS. 17-19 show another driving embodiment according to the present invention. FIG. 17A shows a scanning selection signal applied to a selected scanning electrode line, which shows $2V_0$ at phase $t_1$, 0 at phase $t_2$, and $-2V_0$ at phase $t_3$. FIG. 17B shows a scanning non-selection signal applied to a nonselected scanning electrode line, which is 0 over the phases $t_1$, $t_2$ and $t_3$. FIG. 17C shows an information selection signal applied to a selected signal electrode, which shows $-V_0$ at phase $t_1$, and $V_0$ at phases $t_2$ and $t_3$. FIG. 17D shows an information non-selection signal applied to a nonselected signal electrode, which has a waveform alternately having $-V_0$ at phase $t_1$, $V_0$ at phase $t_2$, and $-V_0$ at phase $t_3$.

FIG. 18A shows a voltage waveform applied to a pixel when the above mentioned scanning selection signal and information selection signal are applied in -phase with each other. FIG. 18B shows a voltage waveform applied to a pixel when the scanning selection signal and the information non-selection signal are applied in phase.

FIG. 18C shows a voltage waveform applied to a pixel when the above mentioned scanning non-selection signal and information selection signal are applied, and FIG. 18D shows a voltage waveform applied to a pixel when the scanning non-selection signal and the information non-selection signal are applied.

FIG. 19 shows the above mentioned driving signals expressed in time series, and voltage waveforms applied to pixels A and C in FIG. 4 are shown at A and C.

As will be understood from FIG. 19, the longest period for which a voltage is applied to a pixel at the time of scanning non-selection is suppressed to 2Δt.

According to the previously described embodiments, even when a display panel using a ferroelectric liquid crystal device is driven at a high speed, the maximum pulse duration of a voltage waveform continually applied to the pixels on the scanning electrode lines to which a scanning nonselection signal is applied is suppressed to two or 2.5 times the writing pulse duration Δt, so that the phenomenon of one display state being inverted to another display state during writing of one whole picture may be effectively prevented.

Figure 21A:
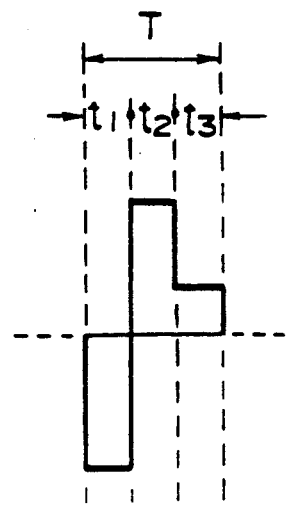
Figure 21B:
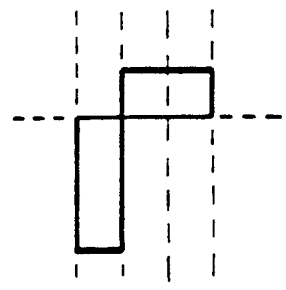
Figure 21C:
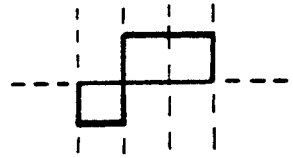
Figure 21D:
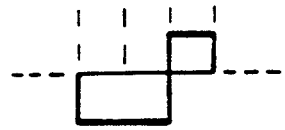
Figure 22:
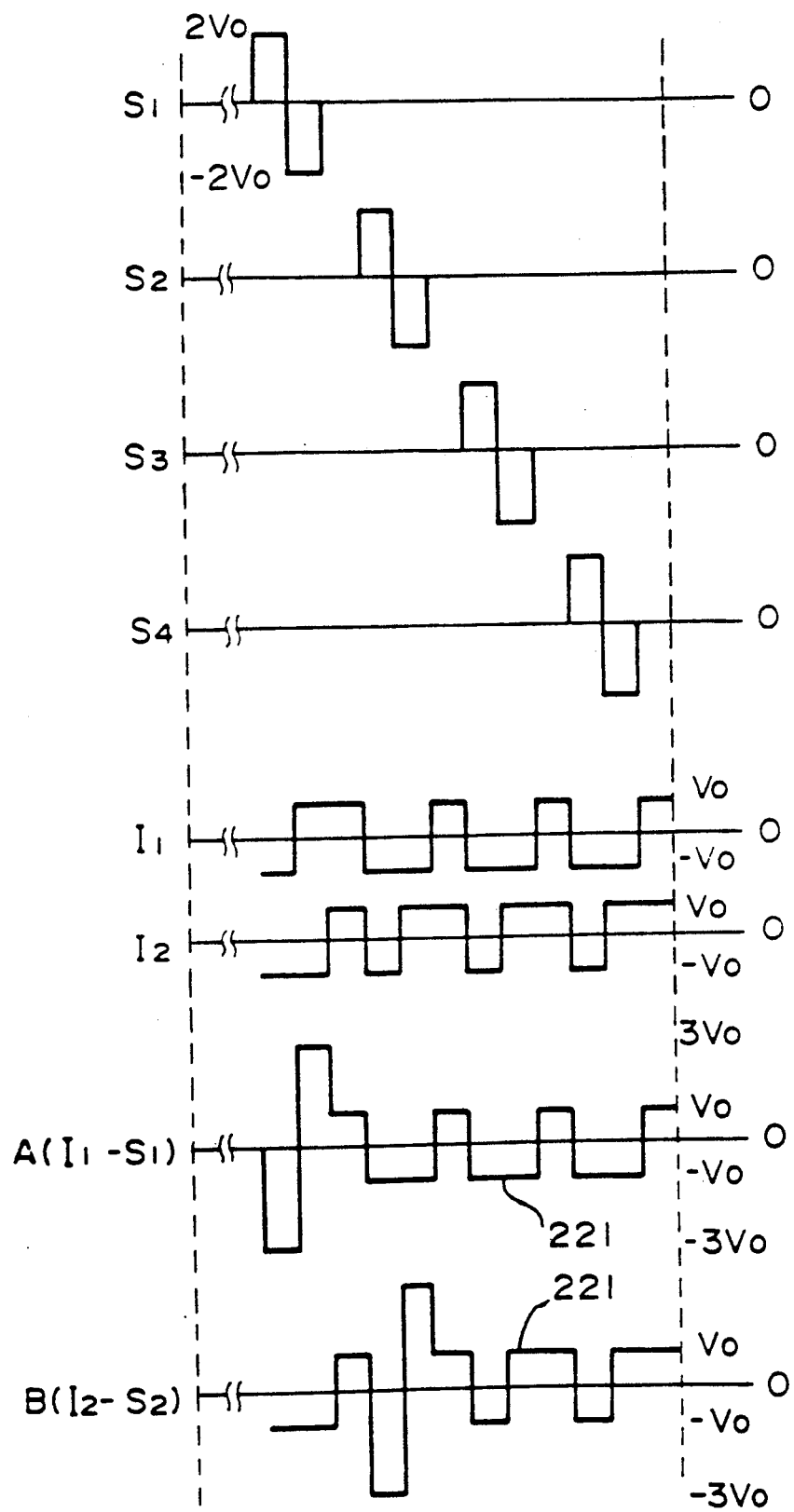
Figure 23A:
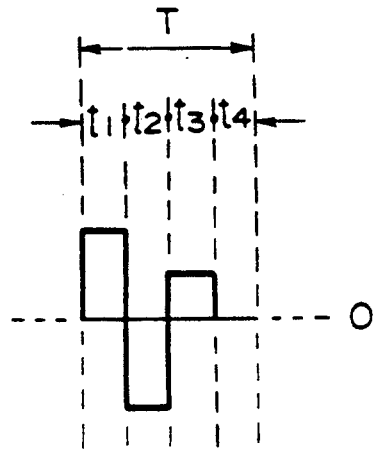
Figure 23B:
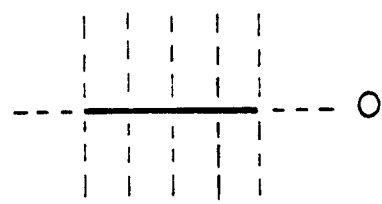
Figure 23C:
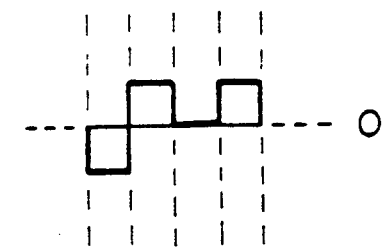
Figure 23D:
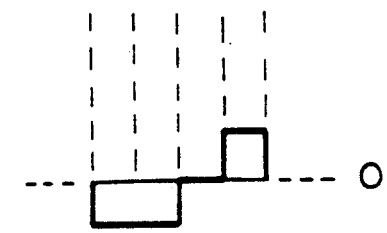

FIGS. 20-22 show another preferred embodiment of the driving method according to the present invention.

FIGS. 20A and 20B show a scanning selection signal applied to a selected scanning electrode S and a scanning non-selection signal applied to the other non-selected scanning electrodes, respectively. FIGS. 20C and 20D show an information selection signal (assumed to provide "black") applied to a selected signal electrode and an information nonselection signal (assumed to provide "white") applied to a nonselected signal electrode. In FIGS. 20A-20D, the abscissa and the ordinate represent time and voltage, respectively. In this embodiment, the lengths of the respective phases are set to satisfy $t_1=t_2=t_3$, and writing is effected during the total period T ($=t_1+t_2+t_3$). The writing period is sequentially allotted to the scanning electrodes 42.

When the first threshold voltage $-V_{th1}$ and the second threshold voltage $V_{th2}$ are defined in the previous embodiments, an electrical signal applied to a selected scanning electrode has voltage levels of $2V_0$ at phase (time) $t_1$, $-2V_0$ at phase $t_2$ and 0 at phase $t_3$ as shown in FIG. 20A. The other scanning electrodes are grounded and the electrical signal is 0 as shown in FIG. 20B. On the other hand, an electrical signal applied to a selected signal electrode has voltage levels of $-V_0$ at phase $t_1$, $V_0$ at phase $t_2$ and again $V_0$ at phase $t_3$ as shown in FIG. 5C. Further, an electrical signal applied to a nonselected signal electrode has voltage levels of $-V_0$ at phase $t_1$, $-V_0$ at phase $t_2$ and $V_0$ at phase $t_3$. In the above, the voltage value $V_0$ is set to a desired value the relationships of $V_0<V_{th2}<3V_0$ and $-V_0>-V_{th1}>-3V_0$.

Voltage waveforms applied to respective pixels when the above electric signals are applied, are shown in FIGS. 21A-21D. FIGS. 21A and 21B show voltage waveforms applied to pixels for displaying "black" and "white", respectively, on a selected scanning electrode, and FIGS. 21C and 21D show voltage waveforms respectively applied to pixels on a nonselected scanning electrode. As shown in FIGS. 21A-21D, all the pixels on a selected scanning electrode are first supplied with a voltage $-3V_0$ exceeding the threshold voltage $-V_{th1}$ at a first phase $t_1$ to be once uniformly brought to "white". Thus, the phase $t_1$ corresponds to a line erasure phase. Among these, a pixel for displaying "black" is supplied with a voltage $3V_0$ exceeding the threshold voltage $V_{th2}$ at a second phase $t_2$, so that it is converted to the other optically stable state ("black"). Further, a pixel for displaying "white" on the same scanning line is supplied with a voltage $V_0$ not exceeding the threshold voltage $V_{th2}$, so that it remains in the one optically stable state.

On the other hand, all the pixels on the non-selected scanning electrodes are supplied with a voltage of $\pm V_0$ or 0, each not exceeding the threshold voltages, so that the liquid crystal molecules therein retain the orientation states corresponding to the signal states resulted in the previous scanning time. Thus, when a scanning electrode is selected, the pixels thereon are once uniformly brought to one optically stable state (white), and then at the next second phase, selected pixels are shifted to the other optically stable state (black), whereby one line of signal states are written, which are retained until the line is selected after one frame of writing is completed.

The third phase $t_3$ in this embodiment is a phase for preventing one direction of weak electric field from being continuously applied. As a preferred example thereof, a signal having a polarity opposite to that of an information signal is applied to the signal electrodes at the phase $t_3$. For example, in the case where a pattern as shown in FIG. 4 is to be displayed, when a driving method having no such phase $t_3$ is applied, a pixel A is written in "black" when a scanning electrode $S_1$ is scanned, whereas during the scanning of the scanning electrodes $S_2$ et seq., an electrical signal of $-V_0$ is continually applied to the signal electrode $I_1$, and the voltage is applied to the pixel A as it is. As a result, it is highly possible that the pixel A is inverted into "white" before long.

At the time of scanning in the driving method, the pixels on a nonselected scanning electrode are once uniformly brought to "white" at a first phase $t_1$, and then at a second phase $t_2$, selected pixels are rewritten into "black". In this embodiment, the voltage for providing "white" at the first phase $t_1$ is $-3V_0$, and the application period thereof is $\Delta t$. On the other hand, the voltage for rewriting into "black" is $3V_0$, and the application period thereof is $\Delta t$. Further, the voltage $V_0$ is applied at the phase $t_3$ for a period of $\Delta t$. The voltage applied to the pixels at time other than the time of scanning is $|\pm V_0|$ at the maximum. The longest period wherein the voltage is continuously applied is $2\Delta t$ as appearing at 221 shown in FIG. 22. As a result, the above mentioned crosstalk phenomenon does not occur at all, and when scanning of one whole picture frame is once completed, the displayed information is semipermanently retained, so that a refreshing step, as required for a display device using a conventional TN liquid crystal having no bistability, is not required at all.

Particularly in this embodiment, the direction of a voltage applied to the liquid crystal layer in the first phase $t_1$ is made on the $\ominus$ side even at the time of non-scanning selection regardless of whether the information signal is for displaying "black" or "white", and the voltage at the final phase (the third phase $t_3$ in this embodiment) is all made $+V_0$ on the $\oplus$ side, whereby the period for applying one continuous voltage which can cause the above mentioned crosstalk phenomenon is suppressed to $2\Delta t$ or shorter. Further, the voltage applied to a signal electrode at the third phase $t_3$ has a polarity opposite to that of the first phase and the same polarity as that of the voltage at the second phase $t_2$ for writing "black". Therefore, the writing of "black" has an effect of making sure of the prevention of crosstalk by the combination of $3V_0$ for $\Delta t$ and $V_0$ for $\Delta t$.

The optimum duration of the third phase $t_3$ depends on the magnitude of a voltage applied to a signal electrode in this phase, and when the voltage has a polarity opposite to the voltage applied at the second phase $t_2$ as an information signal, it is generally preferred that the duration is shorter as the voltage is larger and the duration is longer as the voltage is smaller. However, if the duration is longer, a longer period is required for scanning one whole picture area. For this reason, the duration is preferably set to satisfy $t_3 \leq t_2$.

EXAMPLE 2

A cell prepared in the same manner as in Example 1 was controlled at a temperature of 70° C and subjected to a line sequential driving method as explained with reference to FIGS. 20-23, wherein the respective values were set to $V_0=10$ volts, $t_1=t_2=t_3=\Delta t=50$ μsec., whereby a very good image was obtained.

FIGS. 23-25 show another driving embodiment according to the present invention. FIG. 23A shows a scanning selection signal applied to a selected scanning electrode line, which shows $2V_0$ at phase $t_1$, $-2V_0$ at phase $t_2$, $V_0$ at phase $t_3$, and 0 at phase $t_4$. FIG. 23B shows a scanning non-selection signal applied to a non-selected scanning electrode, which shows 0 over the phases $t_1$, $t_2$, $t_3$ and $t_4$. FIG. 23C shows an information selection signal applied to a selected signal electrode, which shows $-V_0$ at phase $t_1$, $V_0$ at phase $t_2$, 0 at phase $t_3$, and $V_0$ at phase $t_4$. FIG. 23D shows an information nonselection signal applied to a nonselected signal electrode, which shows $-V_0$ at phases $t_1$ and $t_2$, 0 at phase $t_3$, and $V_0$ at phase $t_4$.

Figure 24A:
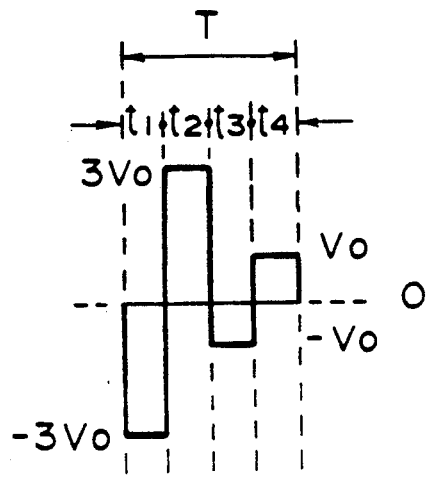
Figure 24B:
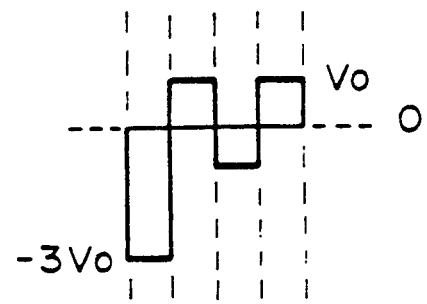
Figure 24C:
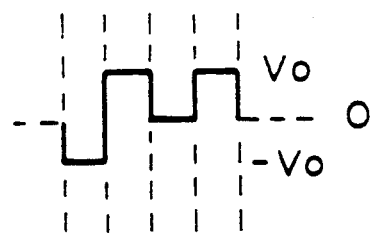
Figure 24D:
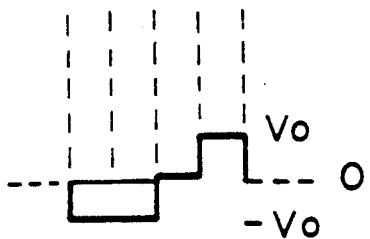

FIG. 24A shows a voltage waveform applied to a pixel when the above mentioned scanning selection signal and information selection signal are applied in phase with each other. FIG. 24B shows a voltage waveform applied to a pixel when the scanning selection signal and the information non-selection signal are applied in phase. FIG. 24C shows a voltage waveform applied to a pixel when the above mentioned scanning non-selection signal and information selection signal are applied, and FIG. 24D shows a voltage waveform applied to a pixel when the scanning nonselection signal and the information non-selection signal are applied. Writing is effected in a period T (=phases $t_1+t_2+t_3t_4$).

FIG. 25 shows the above mentioned driving signals expressed in time series, and voltage waveforms applied to pixels A and C in FIG. 4 are shown at A and C.

Also in this embodiment, the voltages applied at the first phase $t_1$ and at the last phase $t_4$ are set to be of mutually opposite polarities regardless of whether they are for selection or non-selection (or writing or non-writing), whereby the above mentioned period which can cause crosstalk is suppressed to $2\Delta t$ at the longest.

In the above described embodiment, a writing period for one line is divided into 3 or 4 phases. In order to effect a high speed and efficient driving, the number of division should desirably be limited to about 5.

FIGS. 26-29 show another embodiment of the driving method according to the present invention, wherein a whole area-clearing step is provided.

Figures 26A, 26B, 26C:
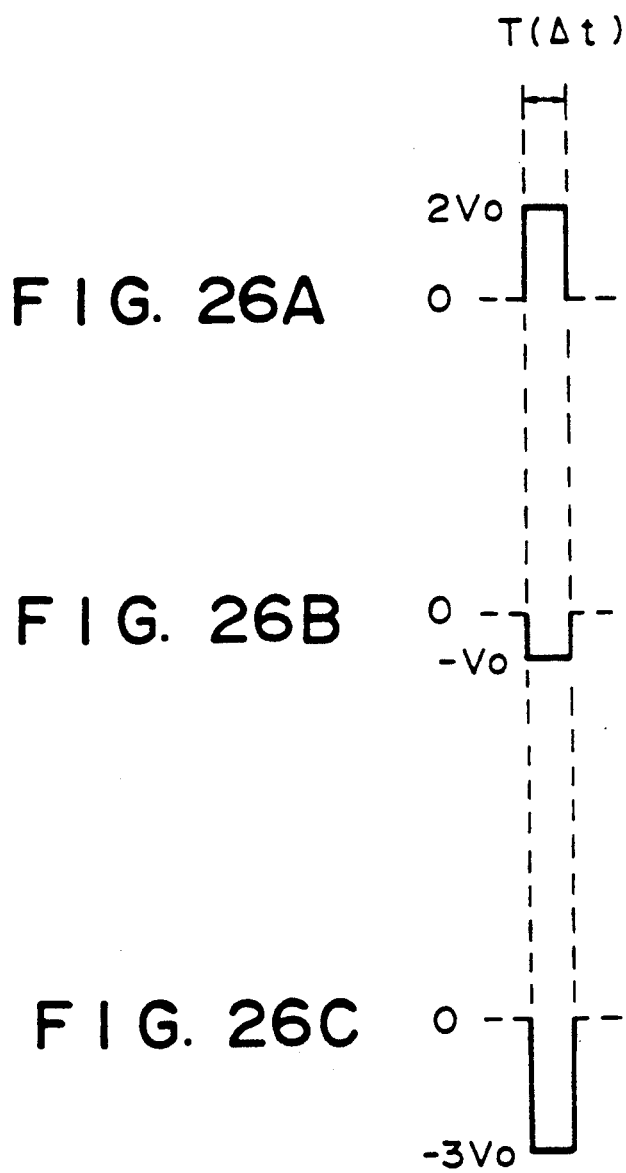
FIGS. 26A-26C show voltage waveforms applied to electrodes in a whole area-clearing step.

FIGS. 26A-26C show electrical signals for uniformly bringing a picture area to "white" (referred to as "whole area - clearing signal") applied prior to writing in a whole area - clearing step T. More specifically, FIG. 26A shows a voltage waveform $2V_0$ applied at a time or as a scanning signal to all or a prescribed part of the scanning electrodes 42. FIG. 26B shows a voltage waveform $-V_0$ applied to all or a prescribed part of the signal electrodes 43 in phase with the signal applied to the scanning electrodes. Further, FIG. 26C shows a voltage waveform $-3V_0$ applied to the pixels. The whole area clearing signal $-3V_0$ has a voltage level exceeding the threshold voltage $-V_{th1}$ of a ferroelectric liquid crystal and is applied to all or a prescribed part of the pixels, whereby the ferroelectric liquid crystal at such pixels is oriented to one stable state (first stable state) to uniformly bring the display state of the pixels to, e.g., a "white" display state. Thus, in the step T, the whole picture area is brought to the "white" state at one time or sequentially.

Figure 27A:
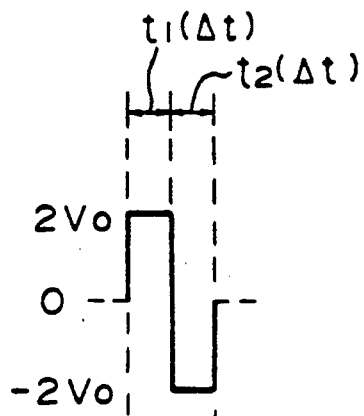
FIGS. 27A-27D respectively show voltage waveforms applied to electrodes in a writing step.
Figure 27B:
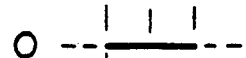
Figure 27C:
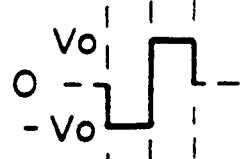
Figure 27D:
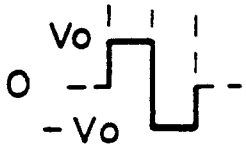

FIGS. 27A and 27B show an electrical signal applied to a selected scanning electrode and an electrical signal applied to the other scanning electrodes (nonselected scanning electrodes), respectively, in a subsequent writing step. FIGS. 27C and 27D show an electrical signal applied to a selected signal electrode (assumed to provide "black") and an electrical signal applied to a nonselected signal electrode (assumed to provide "white"), respectively. As in the preceding embodiments, in FIGS. 26-28, the abscissa and the ordinate represent time and voltage respectively. In FIGS. 27A-27D, $t_2$ and $t_1$ denote a phase for applying an information signal (and scanning signal) and a phase for applying an auxiliary signal, respectively. FIGS. 27A-27D show an example of $t_1 = t_2 = \Delta t$.

The scanning electrodes are successively supplied with a scanning signal. Now, the threshold voltages $-V_{th1}$ and $V_{th2}$ are defined as in the first embodiment. Then, the electrical signal applied to a selected scanning electrode has voltage levels of $2V_0$ at phase $t_1$ and $-2V_0$ at phase $t_2$ as shown in FIG. 27A. The other scanning electrodes are grounded so that the electrical signal is 0 as shown in FIG. 27B. On the other hand, the electrical signal applied to a selected signal electrode has voltage levels of $-V_0$ at phase $t_1$ and $V_0$ at phase $t_2$ as shown in FIG. 27C. Further, the electrical signal applied to a nonselected signal electrode has voltage levels of $V_0$ at phase $t_1$ and $-V_0$ at phase $t_2$ as shown in FIG. 27D. In the above, the voltage value $V_0$ is set to a desired value satisfying the relationships of $V_0 < V_{th2} < 3V_0$ and $-V_0 > -V_{th1} > -3V_0$.

Voltage waveforms applied to respective pixels when the above electric signals are applied, are shown in FIGS. 28A-28D.

FIGS. 28A and 28B show voltage waveforms applied to pixels for displaying "black" and "white", respectively, on a selected scanning electrode. FIGS. 28C and 28D respectively show voltage waveforms applied to pixels on a nonselected scanning electrode.

As shown in FIG. 28A, a pixel on a selected scanning electrode and on a selected signal electrode, i.e., a pixel for displaying "black", is supplied with a voltage $-3V_0$ as shown in FIG. 28A, which is the sum $|3V_0|$ of the absolute value of the voltage applied to the scanning line (FIG. 27A) $|2V_0|$ and the absolute value of the voltage applied to the signal line (FIG. 27C) $|V_0|$, respectively at phase $t_1$, and has a polarity on the side for providing the first stable state. The pixel supplied with $-3V_0$ at phase $t_1$, which has been already brought to the first stable state by application of the whole area - clearing signal, retains the "white" state formed in the whole area - clearing step. Further, a pixel on a non-selected signal electrode is supplied with a voltage of $-V_0$ at phase $t_1$ as shown in FIG. 28B, but does not change the white state preliminary formed in the whole area - clearing step as the voltage $-V_0$ is set to below the threshold voltage.

At phase $t_2$, the pixel on a selected scanning line and on a selected signal electrode is supplied with $3V_0$ as shown in FIG. 28A. As a result, the selected pixel is supplied with a voltage of $3V_0$ exceeding the threshold voltage $V_{th2}$ for the second stable, state of the ferroelectric liquid crystal at phase $t_2$, so that it is transferred to a display state based on the second stable state, i.e., the black state. On the other hand, the pixel on a nonselected electrode is supplied with a voltage of $+V_0$ at phase $t_2$ as shown in FIG. 28B, but retains the display state formed at the phase $t_1$ as it is as the voltage $+V_0$ is set below the threshold voltage. Thus, the phase $t_2$ is a phase for determining the display states of the selected pixel on the scanning electrode, i.e., a display state (contrast) - determining phase with respect to the selected pixel. On the other hand, at the above mentioned phase $t_1$, no pixels on the scanning electrodes are supplied with a voltage exceeding the second threshold voltage, so that the phase $t_1$ may be referred to as an auxiliary phase in which the display state formed in the above mentioned whole area - clearing step T is not changed, and the signal applied to the signal electrodes may be referred to as an auxiliary signal.

Figure 29:
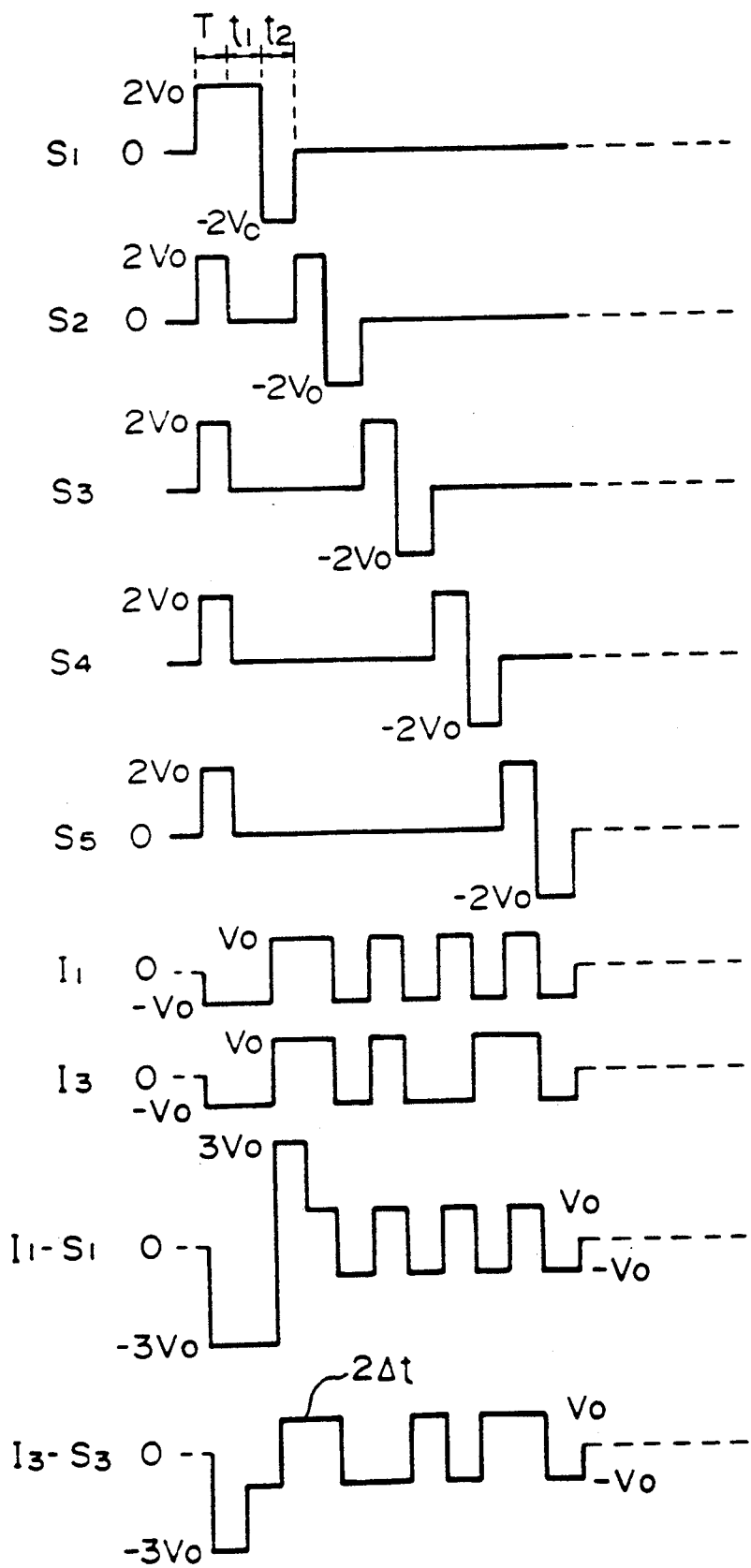
FIGS. 29 shows the above mentioned voltage signals in time series.

FIG. 29 shows the above mentioned driving signals expressed in time series. Electrical signals applied to scanning electrodes are shown at $S_1$-$S_5$, electrical signals applied to signal electrodes are shown at $I_1$ and $I_3$, and voltage waveforms applied to pixels A and C in FIG. 4 are shown at A and C.

In this embodiment, the phase $t_1$ is a phase provided for preventing a weak electric field of one direction from being continually applied. In a preferred embodiment as shown in FIGS. 27C and 27D, signals having polarities respectively opposite to those of the information signals (for providing "black" in FIG. 27C and "white" in FIG. 27D) are applied at phase $t_1$ to the signal electrodes. For example, in a case where a pattern as shown in FIG. 4 is to be displayed, when a driving method using no such phase $t_1$ is applied, a pixel A is written in "black" when a scanning electrode $S_1$ is selected, whereas during the selection of the scanning electrodes $S_2$, et seq., an signal of $-V_0$ is continually applied to the signal electrode $I_1$, and the voltage is applied to the pixel A as it is. As a result, it is highly possible that the pixel A is inverted into "white" before long. In this embodiment, as described above, all the pixels of at least a prescribed part of the pixels on the whole picture area is once uniformly brought to "white", and a pixel for displaying "black" is once supplied with a voltage of $-3V_0$ at phase $t_1$ (but its display state is not determined at this phase) and is supplied with a voltage $3V_0$ for writing "black" in the subsequent phase $t_2$.

The duration of the phase $t_2$ for writing is $\Delta t$, and a voltage of $|\pm V_0|$ is applied at phase $t_2$ for retaining "white" for a period of $\Delta t$. Further, even at time other than scanning, the respective pixels supplied with a voltage of $|-V_0|$ at the maximum and the voltage $|\pm V_0|$ is not continually applied for longer than $2\Delta t$ except for the writing period no matter what display states are continued. As a result, no crosstalk phenomenon occurs at all, and when scanning of one whole picture area is once completed, the displayed information is semipermanently retained, so that a refreshing step, as required for a display device using a conventional TN liquid crystal having no bistability, is not required at all.

FIGS. 30A-30C show another embodiment of whole area - clearing signals. FIG. 30A shows a voltage waveform applied to the scanning lines, which shows $-2V_0$ at phase $P_1$ and $2V_0$ at phase $P_2$. FIG. 30B shows a voltage waveform applied to the signal electrodes, which shows $V_0$ at phase $t_1$ and $-V_0$ at phase $t_2$. FIG. 30C shows a voltage waveform applied to the pixels, which shows $3V_0$ at phase $P_1$ and $-3V_0$ at phase $P_2$, whereby the pixels are once made "black" at phase $P_1$ but is written in a "white" state at phase $P_2$. In this way, all the pixels are supplied with an average voltage of 0, whereby the possibility of causing the above mentioned crosstalk is further decreased.

As described hereinabove, according to the present invention, even when a display panel using a ferroelectric liquid crystal device is driven at a high speed, the maximum pulse duration of a voltage waveform continually applied to the pixels on the scanning electrode lines to which a scanning non-selection signal is applied is suppressed to two (or 2.5) times the writing pulse duration $\Delta t$, so that the phenomenon of one display state being inverted to another display state during writing of one whole picture may be effectively prevented.

What is claimed is:

1. A driving method for an optical modulation device comprising scanning electrodes, signal electrodes disposed intersecting the scanning electrodes so as to form a pixel at each intersection of the scanning electrodes and signal electrodes, and an optical modulation material disposed between the scanning electrodes and the signal electrodes and assuming different orientation states when supplied with voltages of different polarities exceeding threshold voltages; said driving method comprising the steps of:

writing in all or prescribed pixels on a selected scanning electrode of the scanning electrodes in a writing period including at least four phases;

applying voltages of mutually opposite polarities in the first phase and the last phase, having an amplitude not exceeding the threshold voltages of said optical modulation material, to all of the pixels on a nonselected scanning electrode; and applying to said selected scanning electrode two voltage signals having the same amplitude and mutually opposite polarities, a voltage signal having a smaller amplitude than said same amplitude, and a voltage signal 0 voltage, respectively, with respect to the potential of a nonselected scanning electrode in the writing period including said at least four phases, wherein said voltage signal of 0 voltage is applied in the last phase of said at least four phases.

2. A driving method according to claim 1, wherein said smaller amplitude is one half of said same amplitude.

3. A driving method according to claim 1, further comprising the step of continually applying a voltage of a single polarity to a pixel on a scanning electrode, wherein the maximum duration of the continually applied voltage of the same polarity applied to the pixel on the scanning electrode is twice the duration of the first phase.

4. A driving method according to claim 1, wherein said optical modulation material comprises a ferroelectric liquid crystal.

5. A driving method according to claim 4, wherein said ferroelectric liquid crystal comprises a chiral smectic liquid crystal.

6. A driving method according to claim 5, wherein said chiral smectic liquid crystal is disposed in a layer thin enough to release the helical structure of the chiral smectic liquid crystal in the absence of an electric field.

7. A driving method according to claim 1, further comprising the steps of:

applying a voltage of one polarity exceeding a first threshold voltage of the optical modulation material to said all or prescribed pixels in at least one phase of said at least four phases; and applying a voltage of the other polarity exceeding a second threshold voltage of the optical modulation material to a selected pixel of said all or prescribed pixels in at least another phase.

8. An optical modulation apparatus comprising:
   an optical modulation device comprising scanning electrodes, signal electrodes disposed intersecting the scanning electrodes so as to form a pixel at each intersection of the scanning electrodes and signal electrodes, and an optical modulation material disposed between the scanning electrodes and the signal electrodes and assuming a first stable optical state in response to a voltage of one polarity and a second stable optical state in response to a voltage of another polarity exceeding respective threshold voltages, and (b) drive means for:

(b1) sequentially applying to the scanning electrodes a scanning selection signal comprising a pulse of one polarity in a first phase, a pulse of another polarity in a second phase and a pulse of said one polarity in a third phase, and (b2) writing in pixels on a selected scanning electrode by, in the first phase, applying to the signal electrodes a voltage signal which provides a voltage of one polarity simultaneously causing the first optical state at the pixels on the selected scanning electrode in combination with the scanning selection signal to erase the pixels on the selected scanning electrode, in the second phase, selectively applying to the signal electrodes a pulse of one polarity or a pulse of another polarity which provides a voltage of another polarity causing the second optical state or a voltage maintaining the erased state respectively in combination with the scanning selection signal at associated pixels on the selected scanning electrode to write in the associated pixels, and in the third phase, applying to the signal electrodes voltage signals which provide voltages respectively opposite to the voltages applied to the associated pixels on the selected scanning line in the second phase so as to retain the written states at the associated pixels, the polarities of the pulses being defined with respect to a voltage applied to a non-selected scanning electrode, and (b3) applying an alternating voltage to pixels on a non-selected scanning electrode so as to retain the written states of the pixels formed when they have been placed on a selected scanning electrode.

9. An optical modulation apparatus according to claim 8, wherein said optical modulation material comprises a ferroelectric liquid crystal.

10. An optical modulation apparatus according to claim 9, wherein said ferroelectric liquid crystal comprises a chiral smectic liquid crystal.

11. An optical modulation apparatus according to claim 10, wherein said chiral smectic liquid crystal is disposed in a layer thin enough to release the helical structure of the chiral smectic liquid crystal in the absence of an electric field.

* * * * *

UNITED STATES PATENT AND TRADEMARK OFFICE
CERTIFICATE OF CORRECTION

PATENT NO. : 5,255,110
DATED : October 19, 1993
INVENTOR(S) : AKIHIRO MOURI, ET AL.

It is certified that error appears in the above-indentified patent and that said Letters Patent is hereby corrected as shown below:

COLUMN 1

Line 52, "the" should read --in the--.

COLUMN 2

Line 24, "is" should read --as--.
Line 27, "time" should read --time,--.
Line 31, "alternately" should read --alternately during--.
Line 33, "of" should read --of the--.

COLUMN 3

Line 25, "all" should read --all or--.

COLUMN 4

Line 11, "FIGS. 29" should read --FIG. 29--.
Line 40, "compound," should read --compounds--
Line 44, "L" should be deleted.

COLUMN 6

Line 59, "$t_1m$" should read --$t_1$,--.

COLUMN 7

Line 62, "the" should read --but the--.

COLUMN 8

Line 56, "third" should read --second-- and "second" should read --third--.

UNITED STATES PATENT AND TRADEMARK OFFICE
CERTIFICATE OF CORRECTION

PATENT NO. : 5,255,110

DATED : October 19, 1993

INVENTOR(S) : AKIHIRO MOURI, ET AL.

It is certified that error appears in the above-indentified patent and that said Letters Patent is hereby corrected as shown below:

COLUMN 9

Line 11, "electrodes." should read --electrode.--.
Line 13, "applied," should read --applied--.

COLUMN 10

Line 10, "phase" should read --phase,--.
Line 28, "fills" should read --films--.

COLUMN 11

Line 33, "$\pm V_0$" should read --$+V_0$--.

COLUMN 12

Line 5, "$-3-V_0$" should read ---$3V_0$--.
Line 10, "$|V\pm_0|$" should read --$|\pm V_0|$--.
Line 35, "-phase" should read --phase--.

COLUMN 13

Line 22, "value" should read --value satisfying--.

COLUMN 15

Line 17, "(=phases $t_1+t_2+t_3 t_4$)." should read --(=phases $t_1+t_2+t_3+t_4$).--.

COLUMN 16

Line 47, "stable," should read --stable--.

UNITED STATES PATENT AND TRADEMARK OFFICE
CERTIFICATE OF CORRECTION

PATENT NO. : 5,255,110
DATED : October 19, 1993
INVENTOR(S) : AKIHIRO MOURI, ET AL.

It is certified that error appears in the above-indentified patent and that said Letters Patent is hereby corrected as shown below:

COLUMN 17

Line 16, "an" should read --an electrical--.
Line 32, "$|-V_o|$" should read --$|\pm V_o|$--.

COLUMN 18

Line 57, "an" should read --(a) an--.

Signed and Sealed this

Twenty-seventh Day of September, 1994

Attest:

BRUCE LEHMAN

Attesting Officer    Commissioner of Patents and Trademarks